(12) United States Patent
Cha et al.

(10) Patent No.: US 9,461,205 B2
(45) Date of Patent: Oct. 4, 2016

(54) NANOSTRUCTURE SEMICONDUCTOR LIGHT EMITTING DEVICE

(71) Applicant: SAMSUNG ELECTRONICS CO., LTD., Suwon-si, Gyeonggi-do (KR)

(72) Inventors: Nam Goo Cha, Ansan-si (KR); Hyun Seong Kum, Yongin-si (KR); Ju Bin Seo, Seoul (KR); Dong Hoon Lee, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 10 days.

(21) Appl. No.: 14/338,174

(22) Filed: Jul. 22, 2014

(65) Prior Publication Data
US 2015/0102365 A1 Apr. 16, 2015

(30) Foreign Application Priority Data
Oct. 14, 2013 (KR) .................. 10-2013-0122225

(51) Int. Cl.
*H01L 27/15* (2006.01)
*H01L 33/24* (2010.01)
*H01L 33/18* (2010.01)
*H01L 33/08* (2010.01)

(52) U.S. Cl.
CPC ............... *H01L 33/24* (2013.01); *H01L 33/18* (2013.01); *H01L 33/08* (2013.01)

(58) Field of Classification Search
CPC ...................................................... H01L 33/08
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |

(Continued)

FOREIGN PATENT DOCUMENTS

| | | |
|---|---|---|
| JP | 2008-098220 A | 4/2008 |
| JP | 2011-1119612 A | 6/2011 |

(Continued)

*Primary Examiner* — Fernando L Toledo
*Assistant Examiner* — Valerie N Newton

(57) ABSTRACT

A nanostructure semiconductor light emitting device includes a base layer, an insulating layer and a plurality of light emitting nanostructures. The base layer is formed of a first conductivity type semiconductor. The insulating layer is disposed on the base layer and has a plurality of openings through which regions of the base layer are exposed. Each of the light emitting nanostructures is disposed on the exposed regions of the base layer and includes nanocore formed of a first conductivity type semiconductor, and an active layer and a second conductivity-type semiconductor layer sequentially disposed on side surfaces of the nanocore. Upper surfaces of the light emitting nanostructures are non-planar and contain portions free of the second conductivity-type semiconductor layer in order to prevent light emissions during device driving.

20 Claims, 22 Drawing Sheets

(56) References Cited

U.S. PATENT DOCUMENTS

| | | |
|---|---|---|
| 7,319,044 B2 | 1/2008 | Han et al. |
| 7,482,189 B2 | 1/2009 | Lee et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2012/0061641 A1 | 3/2012 | Seong et al. |
| 2013/0099199 A1 | 4/2013 | Cha et al. |
| 2013/0112944 A1 | 5/2013 | Cha et al. |
| 2013/0221385 A1 | 8/2013 | Shibata et al. |
| 2014/0124732 A1 | 5/2014 | Cha et al. |
| 2014/0138620 A1* | 5/2014 | Svensson .............. H01L 33/007 257/13 |

FOREIGN PATENT DOCUMENTS

| | | |
|---|---|---|
| JP | 2011-224749 A | 11/2011 |
| JP | 2012-074673 A | 4/2012 |
| KR | 10-0746784 B1 | 7/2007 |
| KR | 10-2011-0102061 A | 9/2011 |
| KR | 10-2011-0117856 A | 10/2011 |
| KR | 10-2012-0029170 A | 3/2012 |
| KR | 10-2012-0052651 A | 5/2012 |
| KR | 10-2012-0079310 A | 7/2012 |
| KR | 10-2013-0025856 A | 3/2013 |
| KR | 10-2013-0051240 A | 5/2013 |
| KR | 10-1258583 B1 | 5/2013 |

* cited by examiner

NANOSTRUCTURE SEMICONDUCTOR LIGHT EMITTING DEVICE

CROSS-REFERENCE TO RELATED APPLICATION

This application claims priority to, and benefit of Korean Patent Application No. 10-2013-0122225, filed on Oct. 14, 2013, with the Korean Intellectual Property Office, the entire content of which is hereby incorporated by reference.

TECHNICAL FIELD

The present disclosure relates to a nanostructure semiconductor light emitting device.

BACKGROUND

A semiconductor light emitting device such as a light emitting diode (LED) is a device including materials emitting light, and may convert energy generated through the recombination of electrons and electron holes within a junction semiconductor into light to be emitted therefrom. Light emitting diodes are widely used in lighting devices and display devices as lighting sources, and development thereof has accordingly been accelerated.

Recently, a semiconductor light emitting device having a nanostructure and a manufacturing technique thereof have been proposed in order to increase luminous efficiency through improved crystallinity and an increased light emitting area. A semiconductor light emitting device having a nanostructure may generate a relatively low amount of heat and have an increased surface area due to the nanostructure, such that a light emitting area thereof may be increased to enhance luminous efficiency. In addition, an active layer may be obtained from a non-polar surface or a semi-polar surface, preventing luminous efficiency from deteriorating due to polarization and improving droop characteristics.

When different crystal planes are disposed on an upper surface of nanostructure, even in the case in which the active layers are grown under the same conditions, active layer regions disposed on an upper surface of the nanostructure may have different compositions from those of other regions, and thereby generating light having a wavelength thereof different from a wavelength of light generated from other regions. Meanwhile, since active layers disposed on an upper surface of the nanostructure are relatively thin, a problem also exists in which leakage current may possibly be generated.

SUMMARY

An aspect of the present disclosure may provide a nanostructure semiconductor light emitting device having stable luminous efficiency by resolving problems of unstable wavelengths in emitted light and leakage current created in an upper surface of the nanostructure.

One aspect of the present disclosure relates to a nanostructure semiconductor light emitting device including a base layer, an insulating layer, and a plurality of light emitting nanostructures. The base layer is formed of a first conductivity-type semiconductor. The insulating layer is disposed on the base layer and has a plurality of openings through which regions of the base layer are exposed. Each of the plurality of light emitting nanostructures is disposed on the exposed regions of the base layer and includes a nanocore formed of a first conductivity-type semiconductor, and an active layer and a second conductivity-type semiconductor layer which are sequentially disposed on side surfaces of the nanocore. Upper surfaces of the light emitting nanostructures are non-planar and contain portions free of the second conductivity-type semiconductor layer in order to prevent light emissions during device driving.

The upper surfaces of the light emitting nanostructures may contain portions free of the second conductivity-type semiconductor layer and the active layer, whereby the nanocore may be exposed.

The side surfaces of the nanocore may have a crystal plane and the active layer may be disposed on the side surfaces of the nanocore.

The side surfaces of the nanocore may have a crystal plane that is perpendicular to an upper surface of the base layer.

The light emitting nanostructure and the base layer may be formed of nitride single crystals.

The side surfaces of the nanocore may have a non-polar plane.

The non-planar upper surfaces of the light emitting nanostructure may have a convex or concave shape.

The non-planar upper surfaces of the light emitting nanostructures may be uneven surfaces.

The nanostructure semiconductor light emitting device may further include a contact electrode disposed on surfaces of the second conductivity-type semiconductor layers, wherein the non-planar upper surfaces of the light emitting nanostructures may be free of the contact electrode thereon.

A group of nanocores among the plurality of nanocores may have cross-sectional areas different from cross-sectional areas of a remaining group of nanocores among the plurality of nanocores.

A group of nanocores among the plurality of nanocores may have an interval therebetween different from an interval between a remaining group of nanocores among the plurality of nanocores.

Another aspect of the present disclosure encompasses a nanostructure semiconductor light emitting device including a base layer, an insulating layer, a plurality of nanocores, active layers, and second conductivity-type semiconductor layers. The base layer includes a first conductivity-type semiconductor. The insulating layer is disposed on the base layer and has a plurality of openings through which regions of the base layer are exposed. Each of the plurality of nanocores is disposed on the exposed regions of the base layer and formed of a first conductivity-type semiconductor. The active layers and second conductivity-type semiconductor layers, are sequentially disposed on side surfaces of the nanocores. The side surfaces of the nanocores are a crystal plane (e.g. m-plane), and the upper surfaces of the nanocores are non-planar.

The active layers may be disposed on the side surfaces of the nanocores.

The side surfaces of the nanocores may be crystal planes that are perpendicular to an upper surface of the base layer.

The light emitting nanostructures and the base layers may be nitride single crystals, and the side surfaces of the nanocores may include a non-polar plane.

Still another aspect of the present disclosure relates to a nanostructure semiconductor light emitting device including a base layer, an insulating layer, and a plurality of light emitting nanostructures. The base layer is formed of a first conductivity-type semiconductor. The insulating layer is disposed on the base layer and has a plurality of openings through which regions of the base layer are exposed. Each of plurality of light emitting nanostructures is disposed on the exposed regions of the base layer and includes a nanocore formed of a first conductivity-type semiconductor, and an active layer and a second conductivity-type semiconductor layer which are sequentially disposed on side surfaces of the nanocore. Upper surfaces of the light emitting nanostructures are non-planar and contain portions free of the active layer.

BRIEF DESCRIPTION OF THE DRAWINGS

The above and other aspects, features and other advantages of the present disclosure will be more clearly understood from the following detailed description taken in conjunction with the accompanying drawings, in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Figure 1:
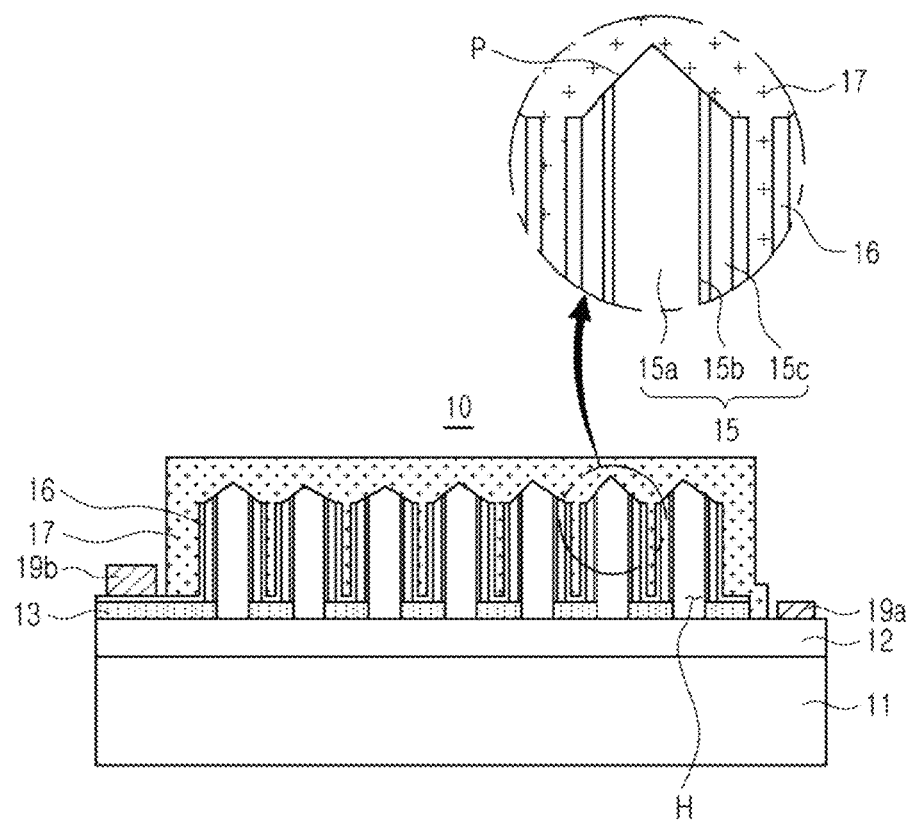
FIG. 1 is a cross-sectional view of a nanostructure semiconductor light emitting device according to an embodiment of the present inventive concept.

Exemplary embodiments of the present inventive concept will now be described in detail with reference to the accompanying drawings.

The present disclosure may, however, be exemplified in many different forms and should not be construed as being limited to the specific embodiments set forth herein. Rather, these embodiments of present inventive concept are provided so that this disclosure will be thorough and complete, and will fully convey the scope of the present disclosure to those skilled in the art.

In the drawings, the shapes and dimensions of elements may be exaggerated for clarity, and the same reference numerals will be used throughout to designate the same or like elements.

FIG. 1 is a side cross-sectional view of a nanostructure semiconductor light emitting device according to an embodiment of the present inventive concept.

As illustrated in FIG. 1, a nanostructure semiconductor light emitting device 10 according to an embodiment of the present inventive concept may include a base layer 12 formed of a first conductivity-type semiconductor and a plurality of light emitting nanostructures 15 formed on the base layer 12.

The base layer 12 may be formed on a substrate 11, providing a growth surface for the light emitting nanostructures 15, as well as electrically connecting one polarity of the plurality of light emitting nanostructures 15.

The substrate 11 may be an insulating substrate, a conductive substrate or a semiconductor substrate. For example, the substrate 11 may be formed of sapphire, SiC, Si, $MgAl_2O_4$, MgO, $LiAlO_2$, $LiGaO_2$, or GaN. The base layer 12 may be a nitride semiconductor containing $Al_xIn_yGa_{1-x-y}N$ ($0 \le x \le 1$, $0 \le y \le 1$, $0 \le x+y \le 1$) and be doped with n-type impurities such as silicon (Si) in order to have a specific conductivity type.

An insulating layer 13 having openings H may be formed on the base layer 12 and the openings H may be provided for growth of the light emitting nanostructures 15. The base layer 12 may be exposed through the openings H and nanocores 15a may be formed on exposed regions of the base layer 12. The insulating layer 13 may be used as a mask for growth of the nanocores 15a. The insulating layer 13 may be formed of an insulating material that may be used in a semiconductor process, such as $SiO_2$ or $SiN_x$.

The light emitting nanostructures 15 may each include the nanocore 15a formed of a first conductivity-type semiconductor, and an active layer 15b and a second conductivity-type semiconductor layer 15c sequentially formed on surfaces of the nanocores 15a.

The active layer 15b may have a multi-quantum well (MQW) structure in which quantum well and quantum barrier layers are alternately stacked. For example, when the active layer 15b is formed of a nitride semiconductor, a GaN/InGaN structure may be used, but a single quantum well (SQW) structure may also be used. The second conductivity-type semiconductor layer 15c may be a crystal containing p-type $Al_xIn_yGa_{1-x-y}N$. The second conductivity-type semiconductor layer 15c may include an electron blocking layer (not illustrated) in a portion thereof adjacent to the active layer 15b. The electron blocking layer may have a multilayer structure in which a plurality of layers having different compositions of n-type $AlxInyGa_{1-x-y}N$ are stacked, or may include at least one layer composed of $Al_yGa_{(1-y)}N$. The electron blocking layer may have a greater band gap than that of the active layer 15b to prevent electrons from flowing to the second conductivity type (e.g., p-type) semiconductor layer 15c.

Upper surfaces of the light emitting nanostructures 15 may be non-planar. As illustrated in FIG. 1, the upper surfaces of the light emitting nanostructures 15 may be pyramidal while the cross section thereof may be triangular.

On the non-planar upper surface P of the nanocore 15, the active layer 15b and the second conductivity-type semiconductor layer 15c may be etched and a surface of the nanocore 15 may be exposed. Accordingly, the upper surfaces of the nanocores 15a may be provided as portions of non-planar upper surfaces P of the light emitting nanostructures 15. Those non-planar upper surfaces P may operate as optical interfaces having an advantage in emitting light from the active layers 15b of the light emitting nanostructures 15.

In the structure of an embodiment of the present inventive concept, the active layer 15b may be present only on side surfaces of the nanocore 15a and not on the upper surface thereof.

In an embodiment of the present inventive concept, since the side surfaces of the nanocore 15a may have a specific crystal plane, the active layer 15b may be formed on the specific crystal plane. When the active layers 15b are grown on different crystal planes, thicknesses and contents of particular ingredients of the active layers 15b may be changed even when the active layers 15b are simultaneously grown under the same growth condition. As a result, the optical characteristics of the active layers 15b may be changed according to the crystal planes. However, according to the structure of an embodiment of the present inventive concept, by removing the active layer disposed on the upper surfaces of the nanocores 15a, most of the active layers 15a may be disposed on the specific crystal plane of the side surfaces of the nanocore 15a, whereby required optical characteristics may be maintained.

Since the side surfaces of the nanocore 15a may be provided as the specific crystal plane, most of the active layers 15b may be formed on only the side surfaces of the nanocore 15a, and the occurrence of differences in optical properties due to differences in the crystal planes may be prevented.

The nanostructure semiconductor light emitting device 10 according to an embodiment of the present inventive concept may include a contact electrode formed in spaces between the light emitting structures. As illustrated in FIG. 1, the contact electrode 16 is not present on the upper surfaces of the light emitting nanostructures 15, and may be disposed to avoid direct contact with the nanocores 15a which are first conductivity-type semiconductor layers.

By employing the structure in which current is not applied to the upper surfaces of nanocores 15a, the problem of leakage current may be resolved. Since thicknesses of semiconductor layers including the active layer and the second conductivity-type semiconductor layer grown on the upper surfaces of the nanocores 15a are smaller than thicknesses of semiconductor layers including the active layer and the second conductivity-type semiconductor layer grown on other regions including the side surface of the nanocores, the leakage current may be concentrated. Such problems may be resolved in the structure according to an embodiment of the present inventive concept.

An insulating protective layer 17 may be formed on the upper surfaces of the light emitting nanostructures 15. The insulating protective layer 17 may prevent an undesired exposure of the light emitting nanostructures, such as the active layer 15b and the like. Even after the contact electrode is formed, spaces may exist between the light emitting nanostructures, and the insulating protective layer 17 may be formed to fill the space. However, the present disclosure is not limited thereto. For example, in other embodiments of the present inventive concept, the electrode element such as the contact electrode may be formed to fill the spaces between the light emitting nanostructures.

As illustrated in FIG. 1, the nanostructure semiconductor light emitting device 10 may include a first electrode 19a and a second electrode 19b. The first electrode 19a may be disposed on an exposed region of the base layer 12 including a first conductivity-type semiconductor. In addition, the second electrode 19b may be disposed on an exposed region in which the contact electrode 16 is extended.

The light emitting nanostructures 15 employed in an embodiment of the present inventive concept will be described in detail with reference to FIGS. 2A and 2B.

Figure 2A:
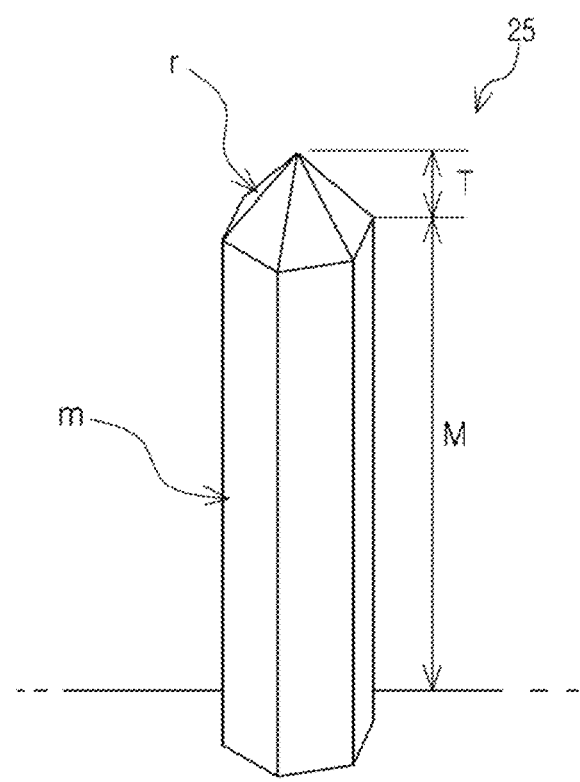
FIGS. 2A and 2B are views illustrating examples of a nanocore employed in an embodiment of the present inventive concept.

As illustrated in FIG. 2A, the nanocore 15a may include a main part M providing side surfaces having a first crystal plane in a growth direction and an upper part T providing surfaces having a second crystal plane different from the first crystal plane.

When nanocore 25 has a hexagonal crystal structure such as a nitride single crystal, the first crystal plane may be a non-polar plane (m-plane), and the second crystal plane may be a plurality of a semi-polar plane (r-plane). The upper part T of nanocores 25 may be a hexagonal pyramid rod structure, like the nanocore 15a illustrated in FIG. 1.

Even when active layers 15b (see FIG. 1) are grown on the surfaces of the nanocores 25 through the same process, a composition of the active layer 15b (in particular, the content of indium) may be different due to differences in characteristics of the respective crystal planes. Consequently, a wavelength of light generated in the active layers grown on the upper surfaces (r-plane) of the nanocore 25 may be different from a wavelength of light generated in the active layers grown on the side surfaces (m-plane) of the nanocore 15a. The difference in wavelengths of light may be problematic and considered to be a defect in implementing uniform light having a desired wavelength. In addition, semiconductor layers are grown on an upper surface, which is a semi-polar plane while being a relatively thin; accordingly, a problem may occur in which a leakage current is concentrated thereon.

To resolve such problems, as illustrated in FIG. 1, a region of the active layer and a second conductivity-type semiconductor layer disposed on an upper surface of nanocore may be removed, whereby the amount of leakage may be decreased, and luminance efficiency may be enhanced. In addition, by disposing the active layer only on a side surface of the nanocore, the wavelength of the generated light may become more precise.

When the crystal plane of the upper surfaces of the nanocore is different from that of the side surface of the nanocore, the embodiment of FIG. 1 may be applied to the nanocore illustrated in FIG. 2A, as well as to other nanocores having a range of crystal structures and shapes. For example, the embodiment of FIG. 1 may also be applied to a type of nanocore in which the upper surface of nanocore is not a semi-polar plane.

Figure 2B:
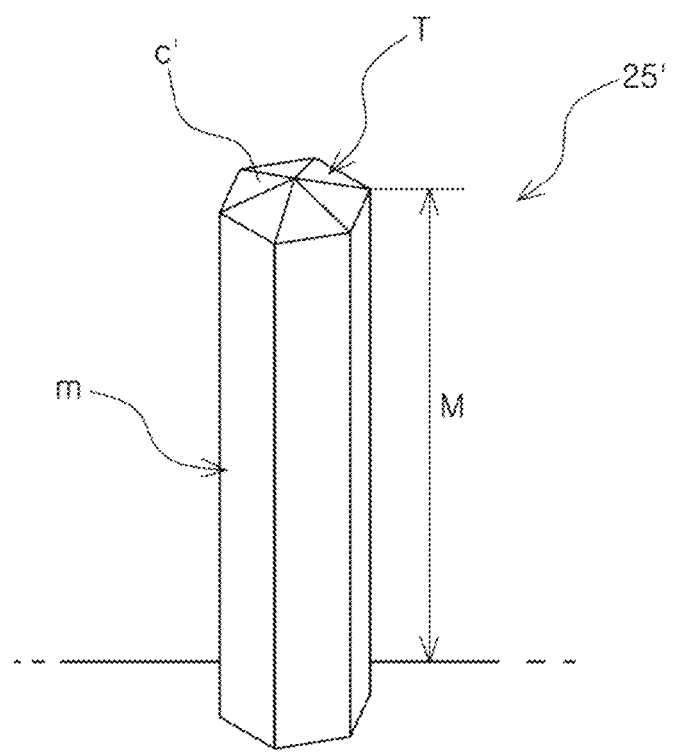

As illustrated in FIG. 2B, a nanocore 25' has a main part M providing a side surface having a first crystal plane r as well as an upper surface T of which a crystal plane is different from that of the first crystal plane, exemplified as being a plane c' which is not substantially a semi-polar plane.

In this configuration, due to differences in characteristics of the respective crystal planes, the composition of the active layers or the thickness of the semiconductor layer grown thereon may be different, and differences in wavelengths of generated light and an occurrence of leakage current may be caused. As illustrated in FIG. 1, current flowing in the active layer on the upper surface T of the nanocore 25' may be prevented by removing the region of the active layer and the second conductivity-type semiconductor layer disposed on an upper surface T of the nanocore 25'. Consequently, a nanostructure semiconductor light emitting device having a high degree of luminous efficiency may be provided.

Although in the embodiment illustrated in FIG. 1, a configuration in which the active layers are not present on the upper surfaces of the nanocore is exemplified, substantial light emissions may be prevented when the active layers disposed on other crystal planes are driven by only removing a second conductivity-type semiconductor layer only, even when active layers are present on the upper surfaces of the nanocores. For example, the active layer disposed on the upper surfaces of the nanocores may be prevented from emitting light by only removing second conductivity-type semiconductor layers (the crystal plane thereof is different from that of the side surface) disposed on the upper surfaces of the nanocores, and forming an insulating protective layer on the active layer.

Selectively removing the layers disposed on the upper surfaces of the nanocore may be implemented through an etching process. FIGS. 3A through 3E are cross-sectional views illustrating main processes of a method of manufacturing a nanostructure semiconductor light emitting device according to an embodiment of the present inventive concept.

Figure 3A:
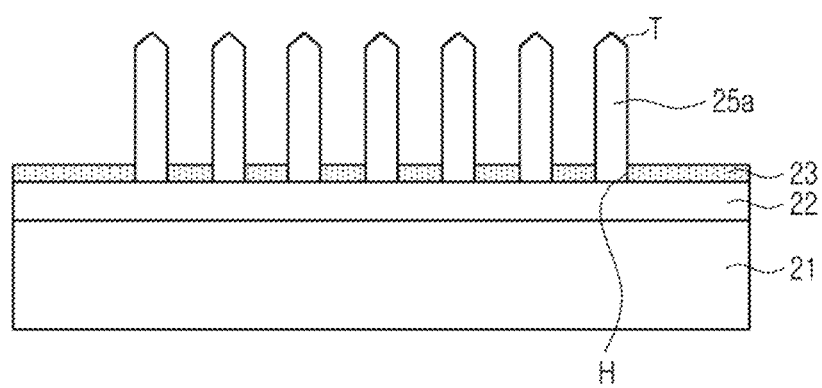
FIGS. 3A through 3E are cross-sectional views illustrating main processes of a method of manufacturing a nanostructure semiconductor light emitting device according to an embodiment of the present inventive concept.

As illustrated in FIG. 3A, the insulating layer 23 formed of a first conductivity-type semiconductor may be disposed as a mask on the base layer 22, and a plurality of nanocores 25a may be disposed on exposed regions of the base layer 22.

The base layer 22 may be formed on a substrate 21, providing a crystal growth surface for growing light emitting nanostructures thereon, as well as electrically connecting one polarity of the light emitting nanostructures. Thus, the base layer 22 may be formed as a semiconductor single crystal having electrical conductivity. When the base layer 22 is directly grown, the substrate 21 may be a crystal growth substrate.

The base layer 22 may be a nitride semiconductor containing $Al_2In_yGa_{1-x-y}N$ ($0 \leq x \leq 1$, $0 \leq y \leq 1$, $0 \leq x+y \leq 1$), and be doped with n-type impurities such as silicon (Si). In this case, the substrate 21 may be formed of sapphire, SiC, Si, $MgAl_2O_4$, MgO, $LiAlO_2$, $LiGaO_2$, or GaN.

Referring to FIG. 3A, the insulating layer 23 may have a plurality of openings H through which regions of the base layer 22 may be exposed. The insulating layer 23 may expose the regions of the base layer 22 by forming the plurality of openings H after depositing an insulating material on the base layer 22. The insulating layer 23 may be formed of an insulating material such as $SiO_2$ or SiN. The openings H may have a width determined in consideration of a desired width of the light emitting nanostructures. For example, the openings H may be formed to have a width of 500 nm or less. Further, the openings H may be formed to have a width of 200 nm. Cross-sectional shapes and arrangements of the openings H may be variously formed; for example, the openings H may have various cross-sectional shapes such as a polygonal shape, a quadrangular shape, an elliptical shape, a circular shape or the like.

The nanocores 25a may be obtained by selectively growing a first conductivity-type semiconductor using the insulating layer 23 as a mask. The first conductivity-type semiconductor of the nanocores 25a may be an n-type nitride semiconductor, and, for example, may be a crystal containing an n-type $Al_xIn_yGa_{1-x-y}N$ ($0 \leq x \leq 1$, $0 \leq y \leq 1$, $0 \leq x+y \leq 1$). The first conductivity-type semiconductor configuring the nanocores 25a may be identical to that of the base layer 22. For example, the base layer 22 and the nanocores 25a may be formed of an n-type GaN.

A nitride single crystal configuring the nanocores 25a may be formed using a metal organic chemical vapor deposition (MOCVD) or a molecular beam epitaxy (MBE) process. The crystal may only be grown on the regions of the base layer 12 exposed through the openings, rather than being formed on the insulating layer 23, whereby desired nanocores 25a may be provided. The upper surfaces T of the nanocores 25a may have a crystal plane different from that of the side surfaces of the nanocore 25a. In an embodiment of the present inventive concept, the nanocore may have a rod shape, but the present inventive concept is not limited thereto. For example, the nanocore may have a polypyramidal shape such as a hexagonal pyramid shape. The shape of the nanocore may be realized by adjusting growth conditions such as growth temperature, growth pressure, and flow amount of a source gas.

Figure 3B:
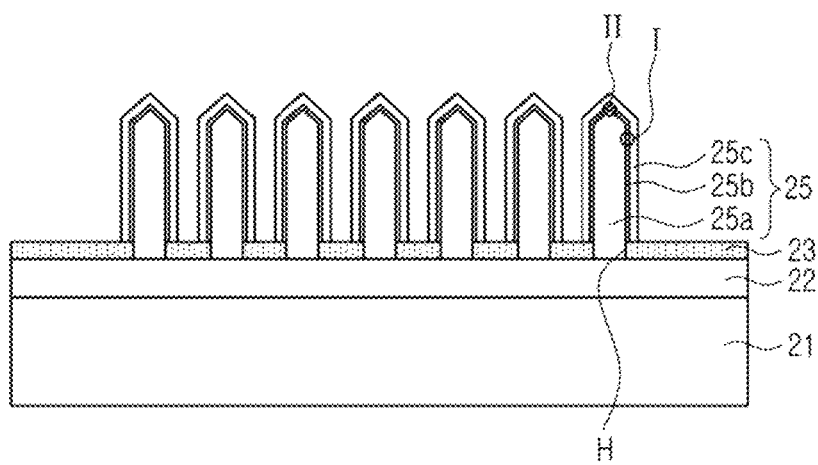

Next, as illustrated in FIG. 3B, an active layer 25b and a second conductivity-type semiconductor layer 25c may be sequentially grown on surfaces of the plurality of nanocores 25a.

Through the process described above, light emitting nanostructures 25 may have a core-shell structure in which the first conductivity-type semiconductor layer is provided as the nanocores 25a, and the active layer 25b and the second conductivity-type semiconductor layer 25c surrounding the respective nanocores 25a are provided as shell layers.

The active layer 25b may have a multiple quantum well (MQW) structure in which quantum well layers and quantum barrier layers are alternately stacked. For example, the active layer 25b may have a GaN/InGaN structure in the case of a nitride semiconductor. Here, the active layer 25b may also have a single quantum well (SQW) structure.

The second conductivity type semiconductor layer 25c may be a crystal containing p-type $Al_xIn_yGa_{1-x-y}N$. The second conductivity-type semiconductor layer 25c may include an electron blocking layer (not illustrated) in a portion thereof adjacent to the active layer 25b. The electron blocking layer (not illustrated) may have a multilayer structure in which a plurality of layers having different compositions of n-type $Al_xIn_yGa_{1-x-y}N$ are stacked or may have at least one layer configured of $Al_yGa_{(1-y)}N$. The electron blocking layer (not illustrated) may have a greater band gap than that of the active layer 25b, thus preventing electrons from flowing to the second conductivity-type (e.g., p-type) semiconductor layer 25c.

As illustrated in FIG. 3B, each of the plurality of nanocores 25a may include a main part providing side surfaces having a first crystal plane in a growth direction and an upper part T (see FIG. 3A) providing an upper surface having a second crystal plane different from the first crystal plane.

When the base layer 22 is a nitride single crystal including an upper surface having a c-plane, the side surfaces of the main part of the nanocores 25a may have a crystal plane being perpendicular to the growth surface of the base layer 22, that is, non-polar (m-) plane, and the upper surface of the upper part may have a c-plane that is perpendicular to the m-plane. In this manner, the surfaces of the nanocore 25 may be configured of a plurality of different crystal planes.

Thus, as described above, even when the active layer 25b is grown on the surfaces of the nanocore 25a through the same process, a composition of the active layer 25b (in particular, the content of indium) may be different due to differences in characteristics of the respective crystal planes.

Specifically, although the active layer 25b is grown through the same process, portion II of the active layer 25b grown on the upper surface (r-plane) of the nanocore 25a may have a content of indium lower than that of portion I of the active layer 25b grown on the side surfaces (m-plane) of the nanocore 25a. As a result, portion II of the active layer 25b grown on the upper surface (r-plane) of the nanocore 25a may emit light having a wavelength longer than desired.

In addition, portions II of active layer disposed on the upper surface (r-plane) of the nanocore 25a may be grown to be thinner than the portions I of the active layer disposed on the side surface (m-plane) of the nanocore 25a. As a result, the problem may occur in which current leaks on the portions II of the active layer disposed on the upper surface (r-plane) of the nanocore 25a.

Thus, in an embodiment of the present inventive concept, a process of removing portions II of the active layer formed on other crystal planes of the nanocore may be additionally undertaken. Such process is illustrated in FIGS. 3C and 3D.

Figure 3C:
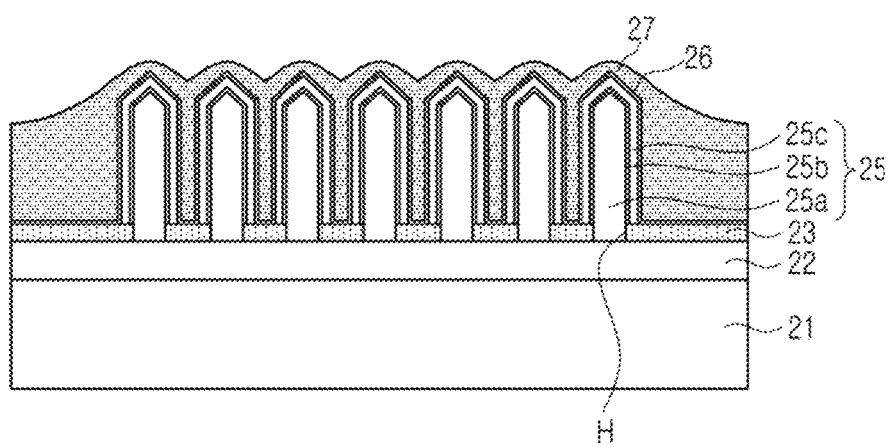
Figure 3D:
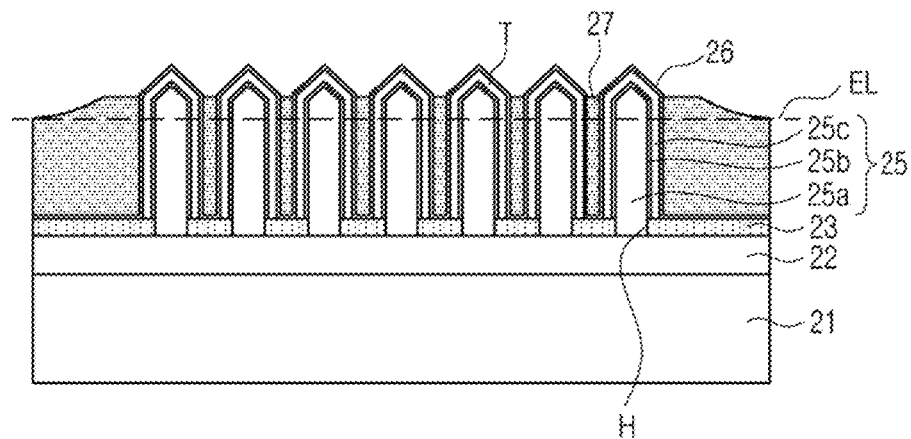

First, a contact electrode 26 may be formed on the light emitting nanostructures 25 as illustrated in FIG. 3C. Additionally, an insulating protective layer 27 may be formed on the contact electrode 26. The insulating protective layer 27 may be formed to fill spaces between the light emitting nanostructures 25.

The contact electrode 26 may be formed of a material suitable for ohmic contact with the second conductivity-type semiconductor layer. The contact electrode 26 may include a material such as Ag, Ni, Al, Rh, Pd, Ir, Ru, Mg, Zn, Pt, Au, or the like, and may have a structure of two or more layers, for example, a layer structure of Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. The contact electrode 26 may be formed by employing a transparent electrode material such as indium tin oxide (ITO), and graphene may be employed if necessary.

Electric insulating materials providing a passivation structure through semiconductor process may be used as an insulating protective layer 27. Materials such as $SiO_2$ or $SiN_x$ may be used as an insulating protective layer 27. In more detail, to easily fill the spaces between the light emitting nanostructures, materials such as Tetra Ethyl Ortho Silane (TEOS), Boro Phospho Silicate Glass (BPSG), CVD-$SiO_2$, Spin-on Glass (SOG), and Spin-on Dielectric (SOD) may be used as the insulating protective layer 27.

In an embodiment of the present inventive concept, the contact electrode 26 may be provided in the form of a thin layer on surfaces of the light emitting nanostructure 25, and fill spaces on the contact electrode 26 with the insulating protective layer 27 operating as a passivation layer. In another embodiment of the present inventive concept, a method of filling the spaces between the light emitting nanostructures 25 by forming a contact electrode with thick films like the insulating protective layer 27 may be employed. The contact electrode 26 may be obtained by forming a seed layer suitable for ohmic contact, on surfaces of the light emitting nanostructures, and then performing electroplating thereon. For example, contact electrode 26 may be formed by sputtering Ag/Ni/Cr layers to a seed layer, and then performing electroplating thereon.

As illustrated in FIG. 3D, the upper surface T of the light emitting structure 25 may be exposed by applying the etching process of selectively removing the insulating protective layer 27. In the process of selectively removing the insulating protective layer of an embodiment of the present inventive concept, oxidation films may be removed to a desired height EL by using dry or wet etching. For example, when the insulating protective layer 27 is an oxidation film or a similar group, plasma belonging to carbon-fluoride (CF) group may be used for the dry etching, and an etchant containing hydrogen-fluoride (HF) such as buffered oxide etchant (BOE) may be used for the wet etching.

A contact electrode may be formed on the regions of the light emitting nanostructure exposed by the selective etching process. In addition, etching process may be performed to remove the portions of the active layer disposed on the other crystal plane (upper surface) of the nanocores 25a together with the contact electrode 26. As a result, as illustrated on FIG. 3E, on the upper surface of the nanocores, the portions of the active layer disposed on the other crystal plane (upper surface) of the nanocores 25a may be removed, whereby remaining portions of the active layer (e.g., 25b and 25c) may only be disposed on the side surfaces of the nanocores 25a. Since the side surfaces of the nanocores 25a have a specific crystal plane, the remaining portions of the active layer 25a may accurately exhibit desired wavelength characteristics and may prevent the occurrence of the leakage current.

In the nanocore 25a, since the side surfaces thereof may generally have a larger area than that of the upper surfaces thereof, effects due to a reduction in light emitting area may not be significant. In particular, when the nanocore 25a has a high aspect ratio, improvements in luminescence properties may be more significant than the defect due to a reduction in light emitting area.

Figure 3E:
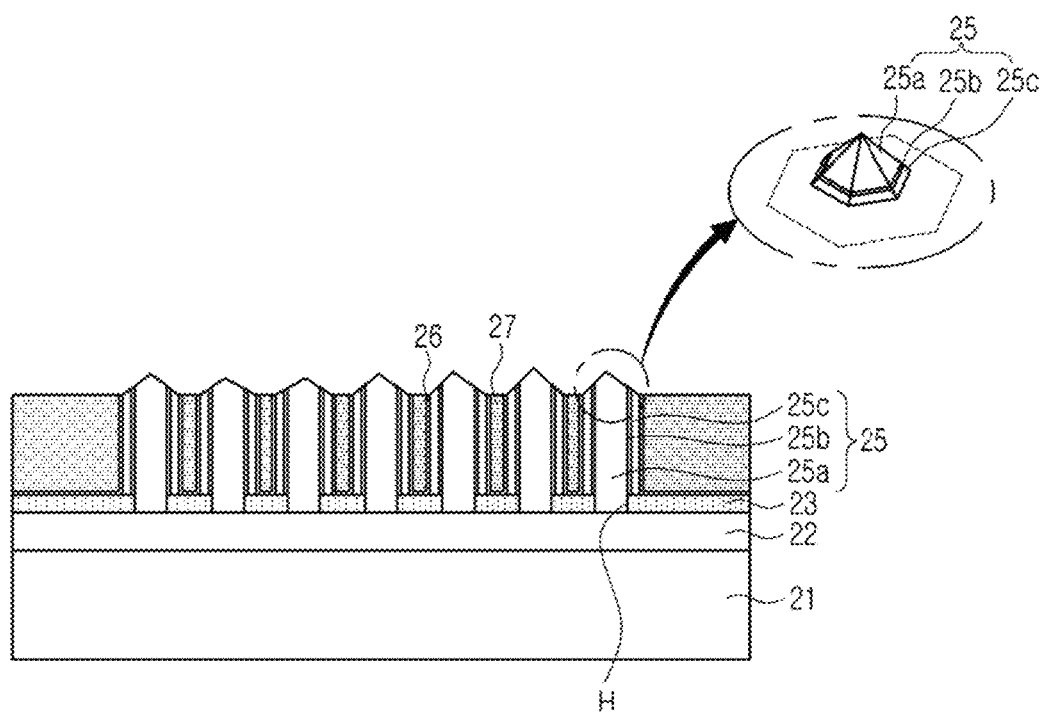

In addition, as illustrated in FIG. 3E, a non-planar surface may be formed on the upper surfaces of the light emitting nanostructures 25. Depending on the etching process conditions and etchant type, the upper surfaces of the light emitting nanostructures 25 may have various shapes, and may have a hexagonal pyramid structure as illustrated in FIG. 3E. Accordingly, by providing the upper surfaces of the light emitting nanostructures 25 as optically unstable surfaces, the luminous efficiency may be enhanced in comparison with a structure in which the entire upper surfaces of the light emitting nanostructures are planes. Simulation results illustrates a 2% increase in the luminous efficiency in a case in which the upper surfaces of the light emitting nanostructures have a hexagonal pyramid structure in comparison to a case in which the upper surfaces of the light emitting nanostructures are planes.

In the etching process on the contact electrode 26 and the light emitting nanostructures, whether to use dry or wet etching, the etching conditions, and etchant type may be selected according to the materials forming the contact electrode 26 and the light emitting nanostructures. For example, when the contact electrode 26 are formed of ITO and the light emitting nanostructures 25 are made of a nitride single crystal, plasma etching process may be used, and Cl$_2$, BCl$_3$, Ar or the combination thereof may be used as plasma gas. In addition, the shape of the upper surfaces of the light emitting nanostructures may be variously altered by the selection of the etchant and by controlling the process conditions. More detail will be provided in the following embodiments.

In a nanostructure semiconductor light emitting device, the electrodes may be formed in various structures. FIGS. 4A through 4E are cross-sectional views illustrating main processes of an electrode formation process.

Figure 4A:
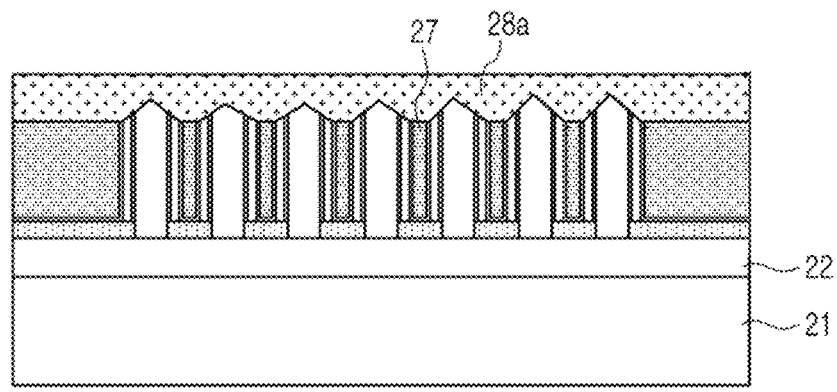
FIGS. 4A through 4E are cross-sectional views illustrating main processes of an electrode formation process for a resultant product of the process illustrated in FIG. 3D.

As illustrated in FIG. 4A, a first passivation layer 28a may be additionally formed on the light emitting nanostructure 25. The first passivation layer 28a may be formed of a material that is the same as or similar to the material of the insulating protective layer 27.

Figure 4B:
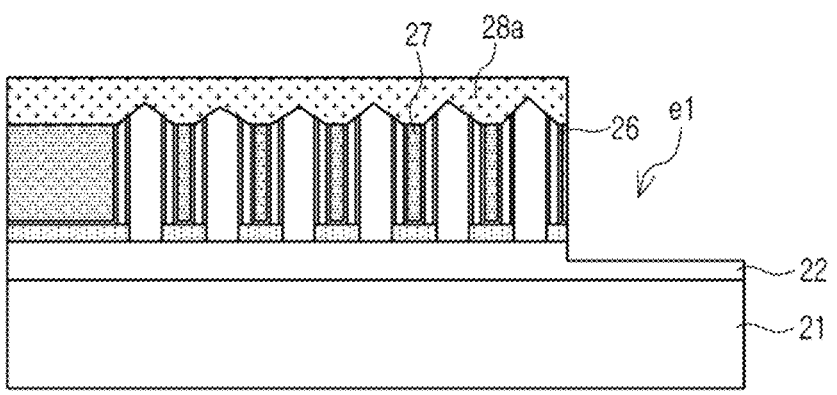

Next, as illustrated in FIG. 4B, a portion e1 of the base layer 22 may be exposed by selectively removing passivation layer 28. The exposed portion e1 may be provided for disposing a first electrode. The removing process may be implemented by using a photo lithography process. In the process, a portion of the light emitting nanostructure 25 disposed on the desired exposed region e1 may be removed, and when the nanocores are not formed on the area in which the electrodes are disposed, the passivation layer on the desired exposed region e1 may be removed without removing the nanocores.

Figure 4C:
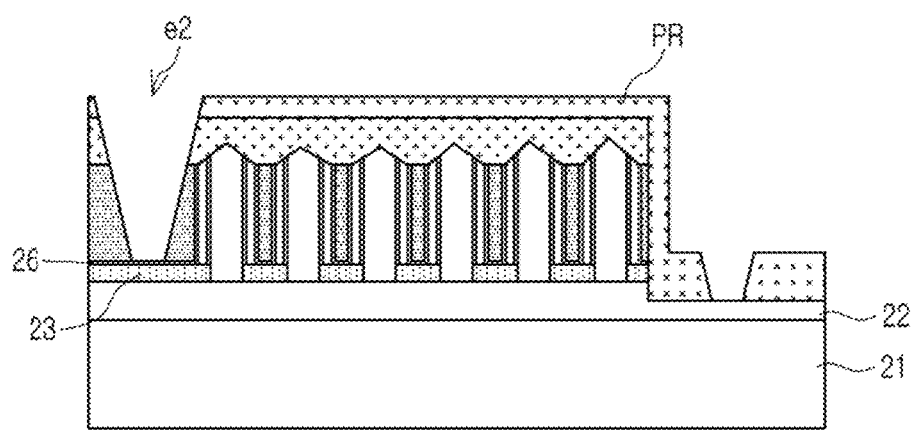

Next, as illustrated in FIG. 4C, a photo resist PR is formed to define contact regions for the electrodes. In the process, selective etching process may be applied to the contact regions for the second electrode to expose a portion e2 of the contact electrode 26.

Figure 4D:
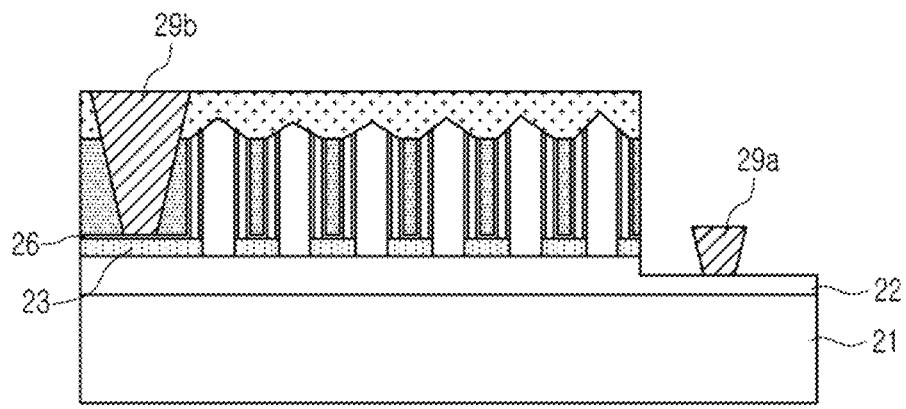

Thereafter, as illustrated in FIG. 4D, first and second electrodes 29a and 29b may be formed on the regions for the electrodes. The first and second electrodes 29a and 29b may be formed of the same material. For example, a material for the first and second electrodes 29a and 29b may be Au, Ag, Al, Ti, W, Cu, Sn, Ni, Pt, Cr, NiSn, TiW, AuSn, or eutectic metals thereof.

Figure 4E:
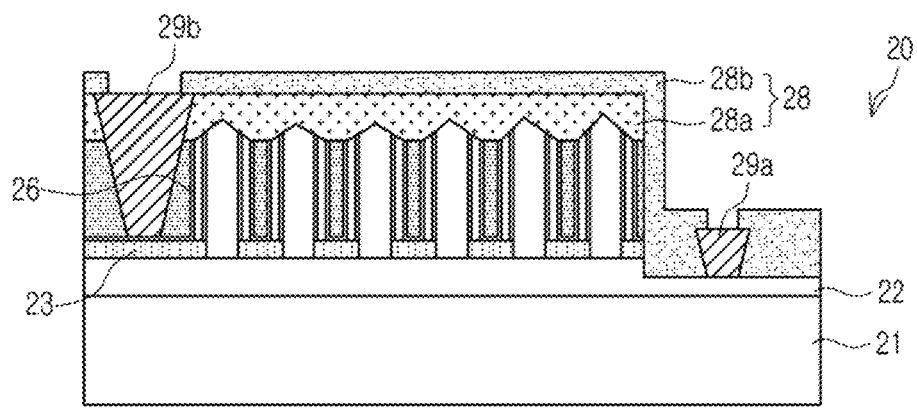

Next, as illustrated in FIG. 4E, additional second passivation layer 28b may be formed, if necessary. The second passivation layer 28b may be used as the protective layer 28 together with the first passivation layer 28a. The second passivation layer 28b may be provided to protect the exposed regions of the semiconductor, also used for firmly supporting the first and second electrodes 29a and 29b. The second passivation layer 28b may be formed of a similar or identical material to that of the first passivation layer 28a.

Figure 5:
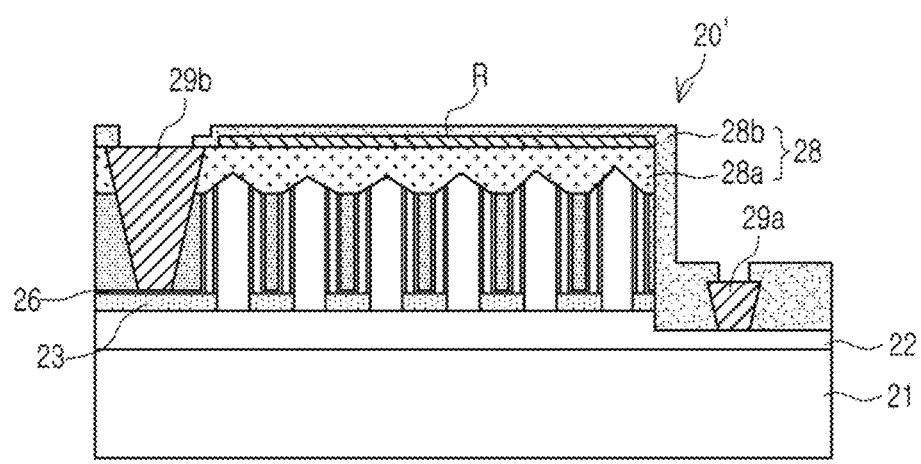
FIG. 5 is a cross-sectional view of a nanostructure semiconductor light emitting device according to another embodiment of the present inventive concept.

FIG. 5 illustrates a light emitting semiconductor device 20' having a flip-chip structure implemented by changing a part (FIG. 4E) of the processes among the detailed processes, according to another embodiment of the present inventive concept.

The light emitting semiconductor device 20', unlike the light emitting semiconductor device 20 illustrated in FIG. 4E, may employ a reflection layer R for guiding light emitted from the light emitting nanostructure 25 toward the direction of the substrate 21. The reflection layer R may be formed on the passivation layer 28a to be disposed on the upper surface of the light emitting nanostructure 25, before forming the second passivation layer 28b in the process described in FIG. 4E. The regions and positions in which the reflection layer R may be formed are not limited thereto. For example, the reflection layer R may be formed on the second passivation layer 28b or on other regions. The reflection layer may be a metallic reflection layer formed of Ag or Al, or an insulation layer formed of dielectric Distributed Bragg reflector (DBR) structure.

The manufacturing method according to an embodiment of the present inventive concept may be variously modified. For example, a process of filling the nanocore using a mask as a mold structure to grow the nanocore may be advantageously used. FIGS. 6A through 6H are cross-sectional views illustrating main processes of a method of manufacturing a nanostructure semiconductor light emitting device according to another embodiment of the present inventive concept.

Figure 6A:
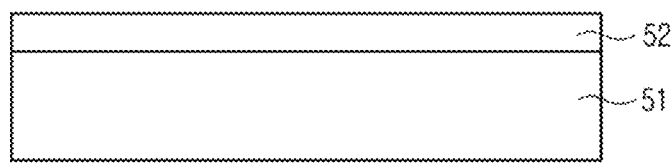
FIGS. 6A through 6H are cross-sectional views illustrating respective main processes of a method of manufacturing a nanostructure semiconductor light emitting device according to another embodiment of the present inventive concept.

As illustrated in FIG. 6A, a base layer 52 may be provided by growing a first conductivity-type semiconductor on a substrate 51.

The base layer 52 may provide a crystal growth surface for growing light emitting nanostructures thereon and may electrically connect one polarity of the light emitting nanostructures. Therefore, the base layer 52 may be formed of a semiconductor single crystal having electrical conductivity. When the base layer 52 is directly grown, the substrate 51 may be a crystal growth substrate.

The base layer 52 may be a nitride semiconductor containing $Al_xIn_yGa_{1-x-y}N$ ($0 \leq x \leq 1$, $0 \leq y \leq 1$, $0 \leq x+y \leq 1$) and may be doped with n-type impurities such as silicon (Si). In this case, the substrate 51 may be formed of sapphire, SiC, Si, MgAl$_2$O$_4$, MgO, LiAlO$_2$, LiGaO$_2$, or GaN.

When the substrate is formed of silicon, the substrate may be warped or broken due to a difference in coefficients of thermal expansion between GaN and silicon, or possibility of defects may be increased due to a difference in lattice constant. Therefore, in this case, since defects need to be suppressed while providing stress control to suppress warping, a buffer layer having a composite structure may be used. For example, on the substrate 51, a crystal not including Ga, such as AlN or SiC, may be used as the buffer layer in order to prevent a reaction between Si and Ga. When of the AlN layer is used as the buffer layer, an AlGaN intermediate layer may be inserted between GaN layers grown on the AlN layer to control stress generated by growing the GaN layers.

The substrate 51 may be entirely or partially removed or patterned during a chip manufacturing process to enhance light emissions or electrical characteristics of an LED chip, before or after growing an LED structure.

For example, in the case of a sapphire substrate, a laser may be irradiated onto an interface between the substrate 51 and the base layer 52 through the substrate 51 to separate the substrate from the base layer. A silicon or silicon carbide substrate may be removed through a planarizing method, an etching method, or the like.

When the substrate 51 is removed, a separate support substrate (not illustrated) may be used. In the support substrate, a reflective metal may be attached thereto or a reflective structure may be inserted between junction layers in order to improve light extraction efficiency of an LED chip.

When the substrate is patterned, unevenness or roughness of an inclined surface may be formed on main surfaces or both side surfaces of the substrate before or after the growth of a single crystal to improve light extraction efficiency and crystalline properties. The size of a pattern may be selected from within a range of 5 nm to 500 μm, and any pattern structure may be used as long as the pattern structure may increase light extraction efficiency using a regular or irregular pattern. The pattern may be variously formed, for example, and may have a pillar shape, a peak-and-valley shape, a semispherical shape, or the like.

Figure 6B:
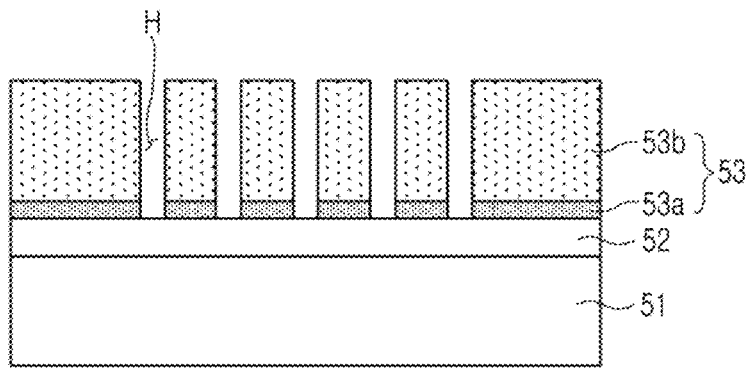

Next, as illustrated in FIG. 6B, a mask 53 having a plurality of openings H and an etch stop layer interposed therein may be formed on the base layer 52.

The mask 53 according to an embodiment of the present inventive concept may include a first material layer 53a formed on the base layer 52, and a second material layer 53b formed on the first material layer 53a. An etching rate of the second material layer 53b may be greater than an etching rate of the first material layer 53a.

The first material layer 53a may be provided as the etch stop layer. That is, the first material layer 53a may have an etching rate lower than that of the second material layer 53b under the same etching conditions. At least the first material layer 53a may be formed of a material having electrical insulation properties, and the second material layer 53b may also be formed of an insulating material as needed.

The first and second material layers 53a and 53b may be formed of different materials to obtain a difference in etching rates. For example, the first material layer 53a may be a SiN layer and the second material layer 53b may be a $SiO_2$ layer. Alternatively, such a difference in etching rates may be implemented using pore density. In this case, the first and second material layers 53a and 53b may be formed of the same material having different pore densities.

The total thickness of the first and second material layers 53a and 53b may be determined in consideration of a desired height of a nanostructure. The first material layer 53a may have a smaller thickness than the second material layer 53b. An etch stop level through the first material layer 53a may be positioned at a depth equal to or less than ⅓ of the overall height of the mask 53, that is, the total thickness of the first and second material layers 53a and 53b, from the surface of the base layer 52.

The overall height of the mask 53, that is, the total thickness of the first and second material layers 53a and 53b, may be 10 nm to 100 μm.

After the first and second material layers 53a and 53b are sequentially formed on the base layer 52, a plurality of openings H may be formed in the first and second material layers to expose regions of the base layer 52 therethrough (see FIG. 6B). The size (e.g., width) of each opening H may be designed in consideration of a desired size of the light emitting nanostructure. For example, the opening H may have a width of 50 nm or less, specifically, 200 nm.

The openings H may be formed through a semiconductor process, for example, a deep-etching process, to have a relatively high aspect ratio. The openings H may be implemented to have an aspect ratio of 5:1 or higher, specifically, 10:1 or higher.

Cross-sectional shapes of the openings H and the alignment thereof may be variously implemented. For example, the opening H may have various cross-sectional shapes such as a polygonal shape, a quadrangular shape, an elliptical shape or a circular shape. Although the opening H illustrated in FIG. 6B has a rod shape, the present inventive concept is not limited thereto. The opening H may be variously shaped using an appropriate etching process.

Figure 6C:
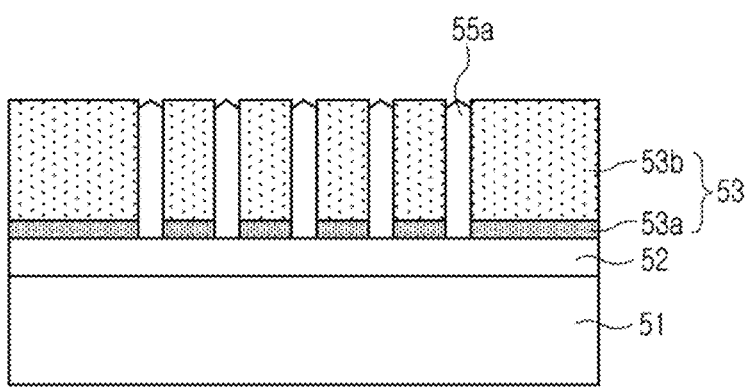

Next, as illustrated in FIG. 6C, a first conductivity-type semiconductor may be grown on the exposed regions of the base layer 52 such that the plurality of openings H are filled with the first conductivity-type semiconductor, thereby forming a plurality of nanocores 55a.

The first conductivity-type semiconductor of the nanocores 55a may be an n-type nitride semiconductor, and, for example, may be a crystal containing n-type $Al_xIn_yGa_{1-x-y}N$ ($0 \le x \le 1$, $0 \le y \le 1$, $0 \le x+y \le 1$). The first conductivity-type semiconductor configuring the nanocores 55a may be formed of the same material as that of the first conductivity-type semiconductor of the base layer 52. For example, the base layer 52 and the nanocores 55a may be formed of n-type GaN.

A nitride single crystal configuring the nanocores 55a may be formed using metal organic chemical vapor deposition (MOCVD) or molecular beam epitaxy (MBE). The mask 53 may serve as a mold for a nitride single crystal grown to provide the nanocores 55a having shapes corresponding to shapes of the openings. That is, the nitride single crystal may be selectively grown on regions of the base layer 52 exposed to the openings H by using the mask 53 to fill the openings H therewith. The nitride single crystal selectively grown on regions of the base layer 52 exposed to the openings H may have a shape corresponding to shapes of the openings H.

Figure 6D:
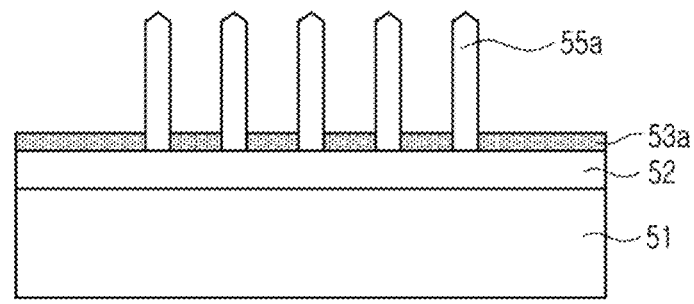

Next, as illustrated in FIG. 6D, the mask 53 may be partially removed using the etch stop layer (e.g., 53a) such that side surfaces of the plurality of nanocores 55a are exposed.

In an embodiment of the present inventive concept, an etching process may be performed in such a manner that only the second material layer 53b may be selectively removed while the first material layer 53a remains intact. In an etching process according to an embodiment of the present inventive concept, the first material layer 53a may be used as the etch stop layer, and in a subsequent process, the first material layer 53a may prevent an active layer 55b and a second conductivity-type semiconductor layer 55c from contacting the base layer 52.

Figure 6E:
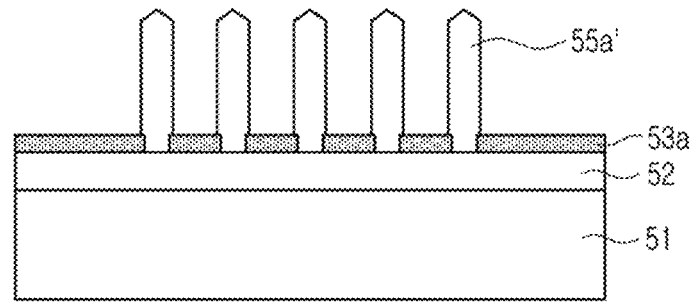

As in the embodiment of the present inventive concept, during the process of manufacturing light emitting nanostructures by using a mask provided with openings as a mold, heat treatment process may be further included to improve crystalline properties. FIG. 6E illustrates a nanocore 55a' that has been heat-treated to have improved crystalline properties.

After removing the mask, a surface of the nanocore 55a may be subjected to heat treatment under predetermined conditions such that a crystal plane of the nanocore 55a may be changed to a stable surface suitable for crystal growth, such as a semi-polar or non-polar crystal plane. Such a process may be explained with reference to FIGS. 7A and 7B.

Figure 7A:
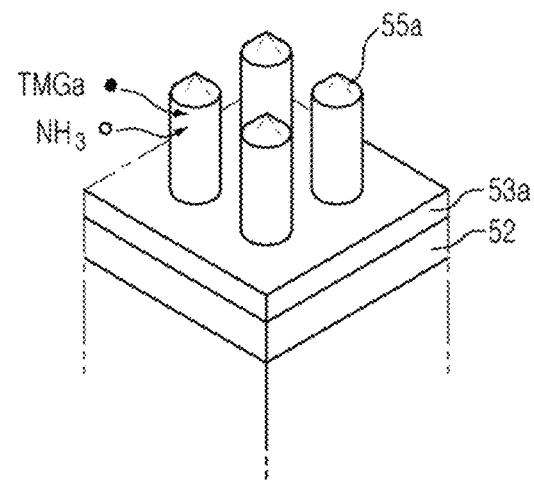
FIGS. 7A and 7B are mimetic diagrams respectively illustrating heat treatment processes applied to FIGS. 6D and 6E.
Figure 7B:
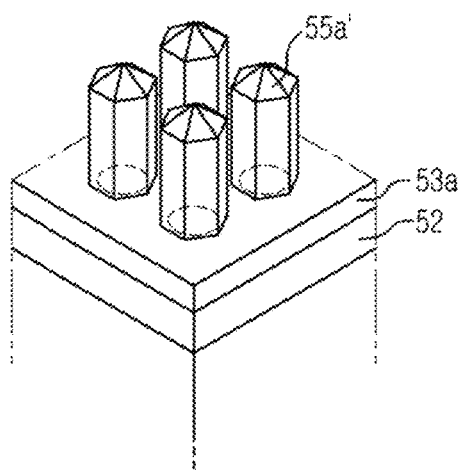

FIGS. 7A and 7B are mimetic diagrams illustrating heat treatment processes applied to the process illustrated in FIG. 6D.

FIG. 7A illustrates nanocores 55a obtained in the process of FIG. 6D. Each of the nanocores may have crystal planes determined depending on a cross-sectional shape of an opening. Although the obtained nanocore 55a has crystal planes determined depending on a cross-sectional shape of the opening, the crystal planes of the nanocore 55a provided as described above may be relatively unstable, deteriorating subsequent crystal growth conditions.

As in an embodiment of the present inventive concept, when the opening has a cylindrical rod shape, a side surface of the nanocore may have a curved surface rather than a specific crystal plane.

When this nanocore is subjected to heat treatment, unstable crystals on the surface thereof (as illustrated in FIG. 7A) may be re-aligned, such that a stable crystal plane such as in a semi-polarity or a non-polarity direction may be formed as illustrated in FIG. 7B. The heat treatment may be performed at a temperature of at least 800° C. for several to several tens of minutes, thereby converting an unstable crystal plane into a stable crystal plane.

For example, when a plane C (0001) of the sapphire substrate is grown, the nanocores illustrated in FIG. 7A may be subjected to heat treatment at a temperature of 800° C. or above to then be converted into a stable curved surface, a non-polar surface (an m-plane). A process of stabilizing such a crystal plane may be implemented through a high-temperature heat treatment process. When crystals positioned on the surface at a relatively high temperature are re-aligned or a source gas remains in a chamber, it can be understood that partial re-growth is performed to allow for a stable crystal plane through deposition of the remaining source gas.

In particular, in the case of re-growth, heat treatment process may be performed in an atmosphere in which a source gas remains in a chamber, or may be performed under conditions of intentionally supplying a relatively small amount of source gas. For example, as illustrated in FIG. 7A, in the case of a metalorganic chemical vapor deposition (MOCVD) chamber, TMGa and $NH_3$ remain, and in this residual atmosphere, the heat treatment may be performed such that the source gas reacts with a nanocore surface to thus realize partial re-growth so as to have a stable crystal plane. Due to the re-growth, the size of the nanocore 55a' may be slightly increased, as illustrated in FIG. 7B.

As described above, the heat treatment may be performed in MOCVD in conditions similar to core formation conditions after removing the mask, and may improve a surface quality of a nanostructure. That is, through the heat treatment process, non-uniformity (for example, a defect or the like) on a surface of a core manufactured after removing the mask may be eliminated, such that a shape of the core can be controlled to have a stable structure, for example, a hexagonal pillar form. A temperature of the heat treatment process as described above may be similar to a temperature in core growth conditions, for example, 800° C. to 1200° C.

Figure 6F:
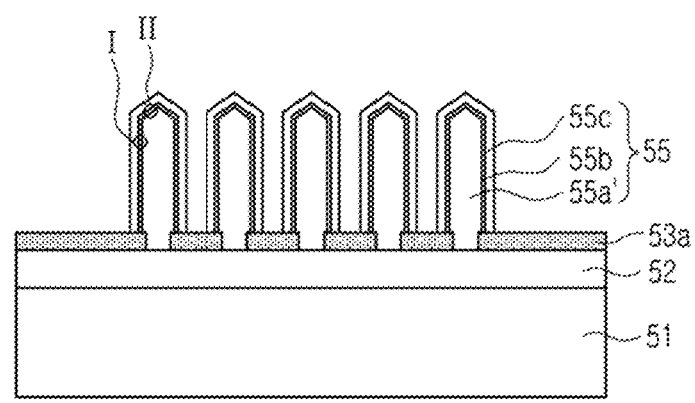

Next, as illustrated in FIG. 6F, the active layer 55b and the second conductivity-type semiconductor layer 55c may be sequentially grown on surfaces of the plurality of nanocores 55a'.

Through the process described above, light emitting nanostructures 55 may have a core-shell structure in which the first conductivity type semiconductor is provided as the nanocores 55a, and the active layer 55b and the second conductivity type semiconductor layer 55c surrounding the respective nanocores 55a are provided as shell layers.

The active layer 55b may have a multiple quantum well (MQW) structure in which quantum well layers and quantum barrier layers are alternately stacked, and, for example, may have a GaN/InGaN structure in the case of a nitride semiconductor. Here, the active layer 55b may also have a single quantum well (SQW) structure.

The second conductivity type semiconductor layer 55c may be a crystal containing p-type $Al_xIn_yGa_{1-x-y}N$. The second conductivity type semiconductor layer 55c may include an electron blocking layer (not illustrated) in a portion thereof adjacent to the active layer 55b. The electron blocking layer (not illustrated) may have a multilayer structure in which a plurality of layers having different compositions of n-type $Al_xIn_yGa_{1-x-y}N$ are stacked, or may have at least one layer configured of $Al_yGa_{(1-y)}N$. The electron blocking layer (not illustrated) may have a band gap greater than that of the active layer 55b to thus prevent electrons from flowing to the second conductivity type (e.g., p-type) semiconductor layer 55c.

Each of the nanocores 55a may include a main part providing a side surface having a first crystal plane in a growth direction and an upper part providing an upper surface having a second crystal plane different from the first crystal plane.

When the base layer 52 is a nitride single crystal including an upper surface having a c-plane, the side surface of the main part may have a crystal plane perpendicular to the growth surface of the base layer 52, that is, a non-polar m-plane, and the upper surface of the upper part may have a semi-polar r-plane different from the m-plane. In this manner, the surfaces of the nanocore 55a may be configured of a plurality of different crystal planes.

Thus, as described above, even when the active layer 55b is grown on the surfaces of the nanocore 55a through the same process, a composition of the active layer 55b (in particular, the content of indium) may be different due to differences in characteristics of the respective crystal planes. Thus, as in FIGS. 6G and 6H, portion II (see FIG. 6F) of the active layer formed on a different crystal plane of the nanocore from which light having a wavelength outside of the desired wavelength range may be emitted may be removed, and a portion I (see FIG. 6F) of the active layer formed on an identical crystal plane of the nanocore may be retained. The process will be additionally processed as illustrated in FIGS. 6G and 6H.

Figure 6G:
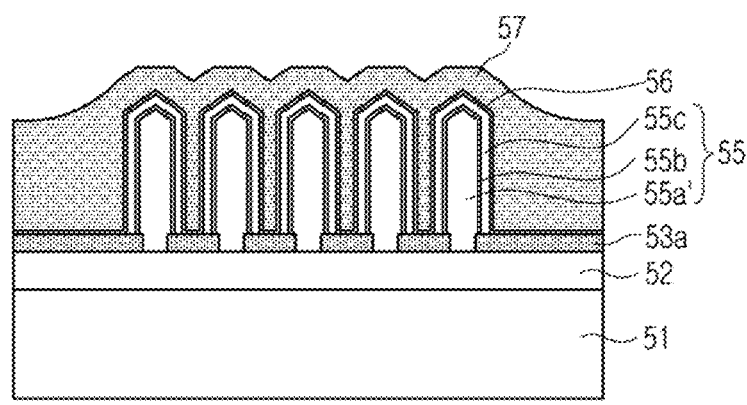
Figure 6H:
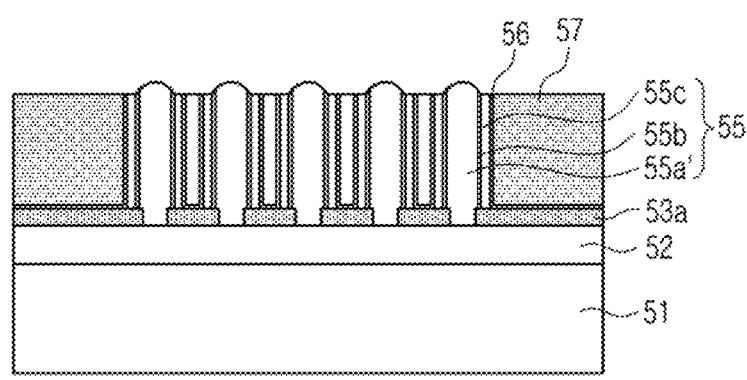

As illustrated in FIG. 6G, the contact electrode 56 may be formed on the upper surface of the light emitting nanostructure 55. Additionally, insulating protective layer 57 may be formed on the contact electrode 56. The insulating protective layer 57 may be formed to fill the spaces between the light emitting nanostructures 55.

The contact electrode 56 may be formed of a material suitable for ohmic contact with the second conductivity semiconductor layer. The contact electrode 56 may include a material such as Ag, Ni, Al, Rh, Pd, Ir, Ru, Mg, Zn, Pt, Au, or the like, and may have a structure of two or more layers; for example, a layer structure of Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. The contact electrode 56 may be formed by employing a transparent electrode material such as indium tin oxide (ITO), and griffin may be employed if necessary.

Electric insulating materials providing a passivation structure through semiconductor process may be used as the insulating protective layers 57. Materials such as $SiO_2$ or $SiN_x$ may be used as the insulating protective layers 57. In more detail, to easily fill the spaces between the light emitting nanostructures, materials such as Tetraethyl Ortho Silane (TEOS), Borophosphosilicate Glass (BPSG), CVD-$SiO_2$, Spin-on Glass (SOG), and Spin-on Dielectric (SOD) may be used as insulating protective layers 57.

As illustrated in FIG. 6H, a first etching process of selectively removing the insulating protective layer 57 to expose the upper surface of the light emitting nanostructures 55 may be applied, after which a second etching process of removing portions of the active layer disposed on the other plane (upper surface) of the nanocore 55a together with the contact electrode 56 may be performed.

In the first etching process, the insulating protective layer 57 may be removed to the desired height by using dry etching or wet etching as the selective etching process to the insulating protective layer 57. For example, when the insulating protective layer 57 is an oxidation film or a similar film, plasma belonging to a CF group may be used for dry etching, and an etchant having HF such as BOE may be used for wet etching.

In the second etching process, the contact electrode 56, active layer 55b and a second conductivity-type semiconductor layer 55c may be removed from the exposed upper surface of the light emitting nanostructure 55, whereby the remaining active layers 55b may be provided on side surfaces of the nanocores 55a. Since the side surfaces of the nanocores 55a have a specific crystal plane, the remaining active layers 55b may have desired accurate wavelength characteristics. In the second etching process of the selective etching process to the light emitting nanostructure 55 and the contact electrode 56, proper process conditions and etchants may be selected according to the materials forming the light emitting nanostructure 55 and the contact electrode 56. For example, when the contact electrode 56 is ITO and the light emitting nanostructure 55 is a nitride single crystal, plasma etching process may be used, and $Cl_2$, $BCl_3$, Ar, or combinations thereof may be used as plasma gas.

As illustrated in FIG. 6H, the upper surface of the light emitting nanostructure 55 may have non-planar surfaces. Although the upper surface of the light emitting nanostructure 55 may have various shapes according to conditions of the etching process and etchant, it can be formed in a nearly hemispherical shape structure as illustrated in FIG. 6H. Since the upper surface of the light emitting nanostructure 55 obtained through an embodiment of the present inventive concept has an optical surface suitable for light extraction efficiency, the luminous efficiency may be improved. Simulation showed that when the upper surface of the light emitting nanostructure is a hemisphere, the luminous efficiency may be improved by 5% compared to a case in which the upper surface of the light emitting nanostructure is flat surface. As such, the shape of the upper surface of the light emitting nanostructure may be variously altered by selecting the type and combination ratio of etchants used for the second etching process and by controlling the process conditions. Further details will be provided below.

Although the mask employed in the embodiment illustrated above exemplifies a structure formed of two layers of materials, the present inventive concept is not limited thereto, and may be implemented to employ a structure formed of more than three material layers.

For example, when a mask has first to third material layers sequentially formed on the base layer, the second material layer may be an etch stop layer, formed of a material different from those of the first and the third material layers. The first and the third material layers may be formed of the same material, if necessary.

Since the second material layer may have a lower etching rate than the third material layer in equal etching conditions, the second material layer may be used as an etch stop layer. At least, the first material layer may have electrical insulating properties, and the second and the third material layers may be insulating materials, if necessary.

In addition, the side surface of the light emitting nanostructure employed in an embodiment of the present inventive concept is exemplified as a face being perpendicular to the surface of the base layer. However, the side surface of the light emitting nanostructure may have a side surface having a predetermined angle of inclination. The inclined side surface may be advantageous for extracting light from the light emitting nanostructures.

The light emitting nanostructures having the inclined side surface may be manufactured through various methods. For example, in a method in which a mask is used as a mold structure, nanocores having the inclined side surface may be formed by providing the opening shape of the mask to have proper inclined surfaces, and light emitting nanostructure having a desired inclined side surface may be formed by growing active layers and the second conductivity-type semiconductor layers to have a predetermined thickness.

Figure 8A:
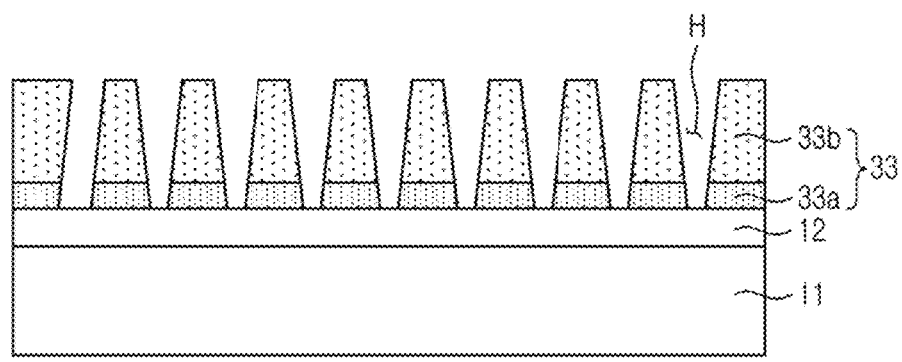
FIGS. 8A and 8B are side cross-sectional views illustrating shapes of an opening that may be formed in a mask employed in an embodiment of the present inventive concept.
Figure 8B:
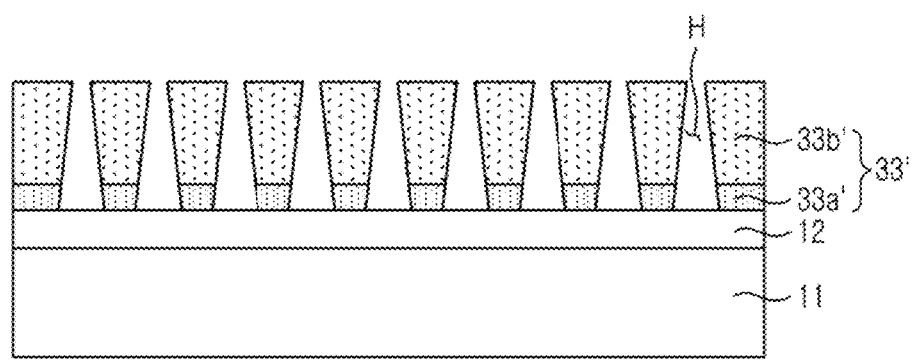

More specifically, although the case in which the openings H illustrated in FIG. 6B have a rod shape is illustrated, the present disclosure is not limited thereto. The shape of the openings H may be variously formed using an appropriate etching process. For example, FIGS. 8A and 8B illustrate different shapes of openings formed in the masks. In FIG. 8A, a mask 33 formed of first and second material layers 33a and 33b may have a pillar shaped opening H having a cross-sectional area gradually increasing in an upward direction. In FIG. 8B, a mask 33' formed of first and second material layers 33a' and 33b' may have a pillar shaped opening H having a cross-sectional area gradually decreasing in the upward direction.

Using such a mask, a nanocore having an inclined surface corresponding to an opening shape and a light emitting nanostructure may be formed.

Various experiments have been implemented to explain the shape of the upper surface of the light emitting nanostructure and the controlling method thereof obtained through the etching process. With reference to the experiments, various operations and effects of the present inventive concept will be described.

Embodiment 1

Nanocores formed of n-type GaN were grown by using a mask as a two-layer mold structure formed of $SiN_x/SiO_2$ (referring to FIGS. 6A-6B), after selectively removing a $SiO_2$ upper mold structure (referring to FIG. 6C), then heat treating the nanocores at about 950° C. (referring to FIG. 6D). Subsequently, the light emitting nanostructures were provided by sequentially forming active layers configured of $In_{0.2}Ga_{0.8}N/GaN$ and p-type AlGaN/GaN as shell layers on the surface of the nanocores (referring to FIG. 6E).

Next, ITO layers were deposited on surfaces of the light emitting nanostructures, and then spaces between the light emitting nanostructures were filled and spin-on glass (SOG) was spread to cover the light emitting nanostructures. (referring to FIG. 6E)

Subsequently, a first etching process was implemented to remove SOG in order to expose upper surfaces of the light emitting nanostructures by using a CF plasma etching process. A second etching process was implemented to remove ITO and a nitride single crystal. As conditions for the second etching process, $BCl_3$ and $Cl_2$ were supplied as a plasma etchant by 100 sccm and 25 sccm, respectively, at 7 mTorr.

Embodiment 2

While the light emitting nanostructures were manufactured through an identical condition to embodiment 1, a different plasma etchant was used at the second etching process. That is, according to an embodiment of the present inventive concept, the second etching process was implemented by only supplying $Cl_2$ by 1150 sccm without using $BCl_3$.

Embodiment 3

While the light emitting nanostructures were manufactured through the same condition as embodiment 1, a different plasma etchant was used at the second etching process. That is, according to an embodiment of the present inventive concept, Ar was used as a plasma etchant instead of using $BCl_3$, and the second etching process was implemented by supplying Ar and $Cl_2$ by 10 sccm and 150 sccm, respectively.

To examine shapes of the upper surface of the light emitting nanostructures obtained in embodiments 1 through 3, Scanning Electron Microscope (SEM) photos were taken. FIGS. 9A and 9B, FIGS. 10A and 10B, FIGS. 11A and 11B show the results.

Figure 9A:
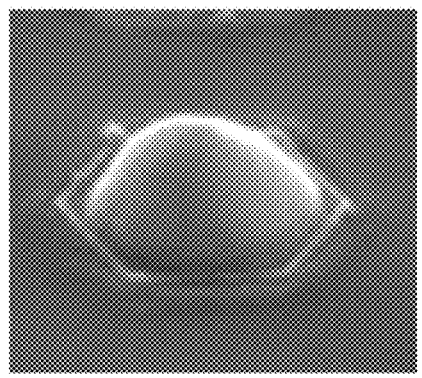
FIGS. 9A and 9B are photographed images of an upper surface of nanostructures obtained from the first embodiment of present inventive concept.
Figure 9B:
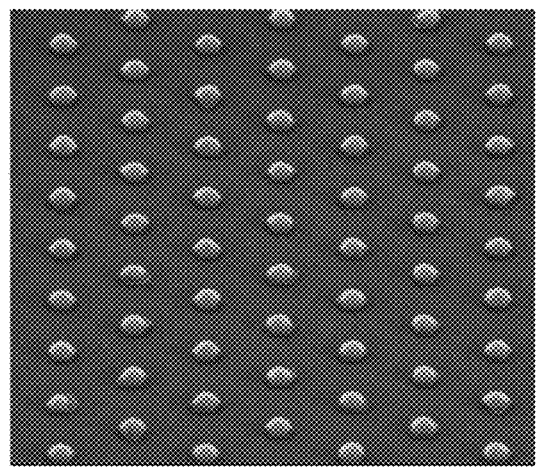

With reference to FIGS. 9A and 9B, the upper surfaces of the light emitting nanostructures obtained in embodiment 1 may have a nearly hemispherical shape. The upper surfaces of the light emitting nanostructures may have a hemispherical shape or a conical shape with a triangular cross section, by adding $BCl_3$ so as to strengthen isotropic etching to a nitride single crystal.

Figure 10A:
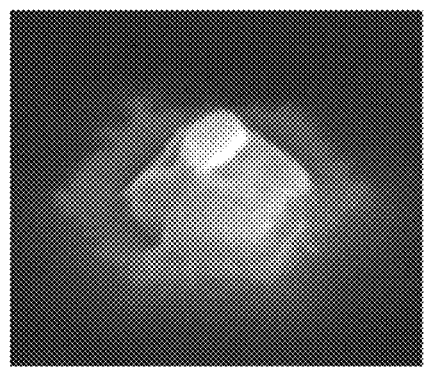
FIGS. 10A and 10B are photographed images of an upper surface of nanostructures obtained from the second embodiment of present inventive concept.
Figure 10B:
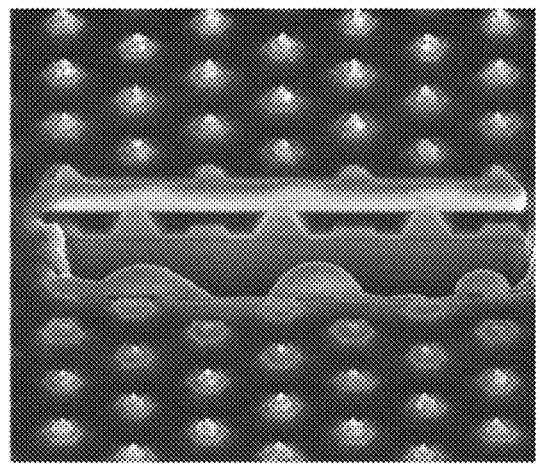

With reference to FIGS. 10A and 10B, the upper surfaces of the light emitting nanostructures obtained in embodiment 2 may have a concavo-convex surface. Under the etchant conditions of an embodiment of the present inventive concept, since the etching rate in the inclined plane (r plane) is relatively high, uneven pits may be formed on the inclined plane, and the upper surface may be formed to be concavo-convex.

Figure 11A:
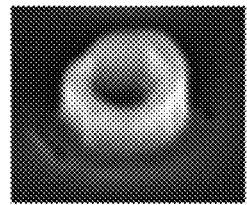
FIGS. 11A and 11B are photographed images of an upper surface of nanostructures obtained from the third embodiment of present inventive concept.
Figure 11B:
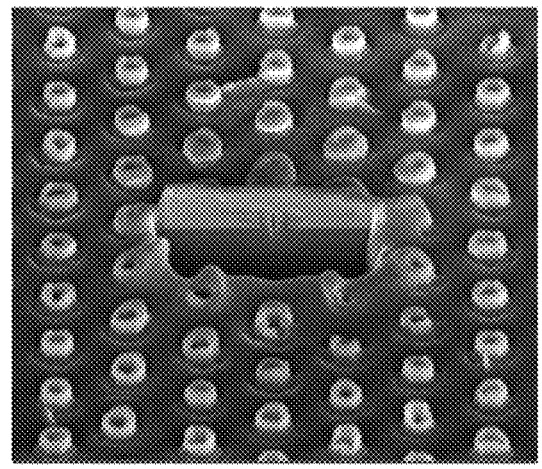

With reference to FIGS. 11A and 11B, the upper surfaces of the light emitting nanostructures obtained in embodiment 3 may have a concave surface. The upper surfaces of the light emitting nanostructures may be formed to have a concave shape by adding Ar to improve the etching rate.

By selecting a kind of etchant and by controlling conditions of the etching process, the shape of the upper surfaces of the light emitting nanostructures may be variously modified.

Figure 12A:
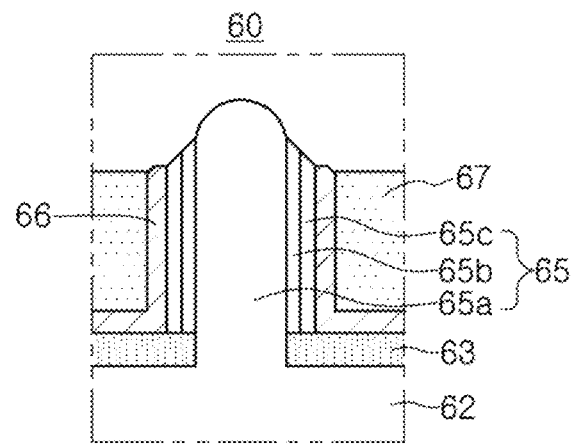
FIGS. 12A through 12C are cross-sectional views illustrating various examples of nano-light emitting structures employed in an embodiment of the present inventive concept.
Figure 12B:
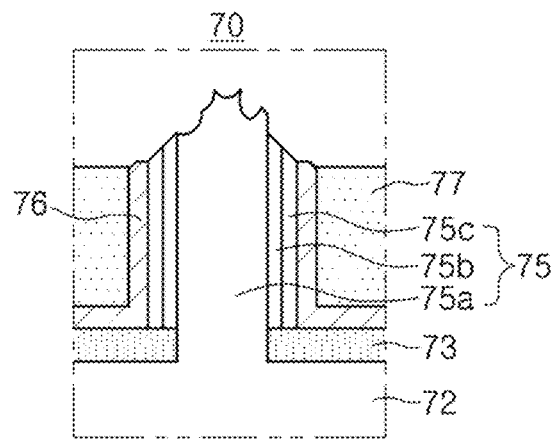
Figure 12C:
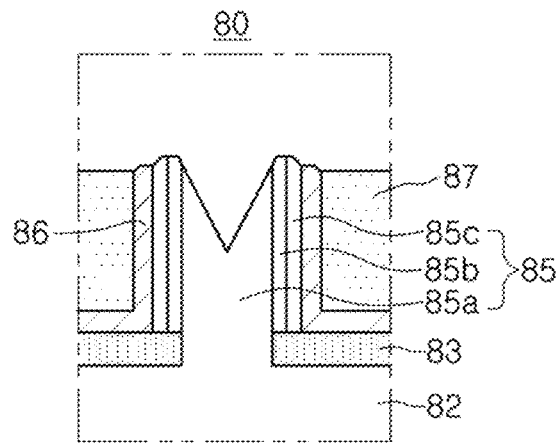

FIGS. 12A through 12C are cross-sectional views illustrating various examples of nano-light emitting structures 60, 70 and 80 employed in embodiments of the present inventive concept. The structures 60, 70 and 80 illustrated in FIGS. 12A through 12C, respectively, may be understood as exemplifying the light emitting nanostructures obtained in embodiments 1 through 3.

With reference to FIG. 12A, insulating films 63 having openings H are formed on a base layer 62. The light emitting nanostructures 65 may have nanocores 65a formed through the openings H, and an active layer 65b and a second conductivity-type semiconductor layer 65c sequentially disposed on surfaces of the nanocores. A contact electrode 66 is disposed on surfaces of the light emitting nanostructure 65, that is, on the surfaces of the second conductivity-type semiconductor layer, and the insulating protective layer 67 may be disposed in the spaces between the light emitting nanostructures 65. The second conductivity-type semiconductor layer 65c and the active layer 65c may be partially removed on the upper surface of the light emitting nanostructures 65, and the upper surface of the nanocore 65a may have a convex shape.

With reference to FIG. 12B, insulating films 73 having openings H are formed on a base layer 72. The light emitting nanostructure 75 may have nanocores 75a formed through the openings H, and an active layer 75b and a second conductivity-type semiconductor layer 75c sequentially disposed on surfaces of the nanocores. A contact electrode 76 is disposed along surfaces of the light emitting nanostructure 75, that is, on the surfaces of the second conductivity-type semiconductor layer 75c, and the insulating protective layer 77 is disposed in the spaces between the light emitting nanostructures 75. The second conductivity-type semiconductor layer 75c and the active layer 75b may be partially removed on the upper surface of the light emitting nanostructures 75, and the upper surface of the nanocore 75a may have an uneven concave and convex shape.

With reference to FIG. 12C, insulating films 83 having openings H are formed on a base layer 82. The light emitting nanostructure 85 may have nanocores 85a formed through the openings H, and an active layer 85b and a second conductivity-type semiconductor layer 85c sequentially disposed on surfaces of the nanocores. A contact electrode 86 is disposed on surfaces of the light emitting nanostructure 85, that is, on the surfaces of the second conductivity-type semiconductor layer 85c, and the insulating protective layer 87 is disposed in the spaces between the light emitting nanostructures 85. The second conductivity-type semiconductor layer 85c and the active layer 85b may be partially removed on the upper surface of the light emitting nanostructures 85, and the upper surface of the nanocore 85a may be over-etched and have a concave shape.

In the above embodiments, a manufacturing method of a nanostructure semiconductor light emitting device growing nanocores by using a mask in which openings are formed as a mold structure according to the embodiment have been illustrated. However, the present disclosure is not limited thereto, and may be modified to be various specific embodiments.

In another embodiment of the present inventive concept, when a nanocore is grown using mask as a mold, an upper part of the nanocore may have another shape, or a plurality of nanocores may be grown to have different heights, thus causing an uneven structure or a rough structure. In order to prevent a non-uniform distribution of nanocores from having a disadvantageous influence on a semiconductor light emitting device, a planarizing process may be further included after forming the plurality of nanocores, such that upper surfaces of the plurality of nanocores may be planarized to have the same level.

As such, in the process of planarizing the nanocores to have the same level, at least a portion of nanocores among the plurality of nanocores may be formed such that at least one of cross-sectional areas and intervals between the at least a portion of nanocores are different from cross-sectional areas and intervals of remaining nanocores.

By designing any one of the cross-sectional areas of the light emitting structures and intervals therebetween to be differentiated, even in the case in which the same active layer formation process is applied thereto, two or more different wavelengths of light may be emitted.

As described above, two or more different wavelengths of light may be emitted by differentiating the shapes of nanostructures, thereby obtaining white light from a single device.

FIGS. 13A through 13F are cross-sectional views illustrating main processes of a method of manufacturing a nanostructure semiconductor light emitting device according to another embodiment of the present inventive concept (e.g., a planarizing process).

Figure 13A:
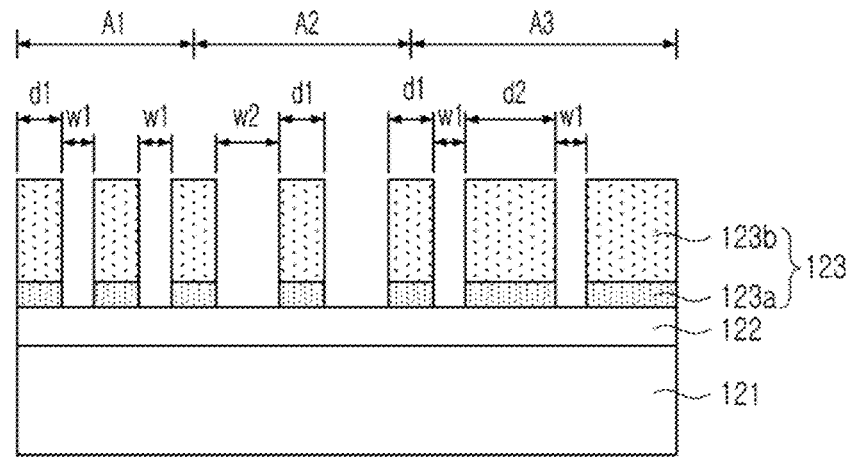
FIGS. 13A through 13F are cross-sectional views illustrating main processes of a method of manufacturing a nanostructure semiconductor light emitting device according to another embodiment of the present inventive concept (a planarizing process introduction).

First, as illustrated in FIG. 13A, a mask 123 having a plurality of openings H and an etch stop layer interposed therein may be formed on a base layer 122 formed on a substrate 121.

The mask 123 according to an embodiment of the present inventive concept may include a first material layer 123a formed on the base layer 122 and a second material layer 123b formed on the first material layer 123a. An etching rate of the second material layer 123b may be higher than that of the first material layer 123a.

The openings H may have different shapes. In detail, in an embodiment of the present inventive concept, three different groups of openings may be formed. Openings A2 of a second group have an interval d1 therebetween, identical to an interval d1 between openings A1 of a first group. The openings A2 of the second group may have a width w2 greater than a width w1 of the openings A1 of the first group. Openings A3 of a third group may have a width w1 identical to the width w1 of the openings A1 of the first group. The openings A3 of the third group may have an interval d2 therebetween greater than the interval d1 between the openings A1 of the first group.

Generally, an increase in an interval between the openings indicates a relative increase in a contact amount of source gas with regard to the same area, and thus, a growth speed of nanocores 125a may be relatively fast. The increase in width of the opening indicates a relative reduction in the contact amount of source gas in the same area, and thus, the growth speed of the nanocores 125a may be relatively slow.

Figure 13B:
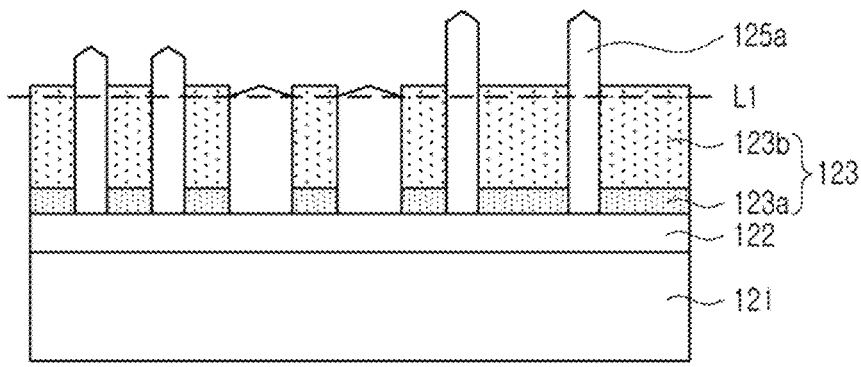

For reasons described above, the nanocores 125a may have different heights for respective groups, for example, three groups, due to the difference in growth speed of the nanocores 125a between the width of the opening and the interval between the openings as illustrated in FIG. 13B. In order to improve the non-uniform height, planarization may be performed in the present process to form an appropriate level (e.g., L1 as illustrated in FIG. 13B) as illustrated in FIG. 13C, thereby achieving a uniform height of the nanocores 125a for each group.

Since the mask 123 is used as a structure supporting the nanocores 125a in the planarization process as described above, the planarization process may be easily performed without damage to the nanocores 125a.

Figure 13C:
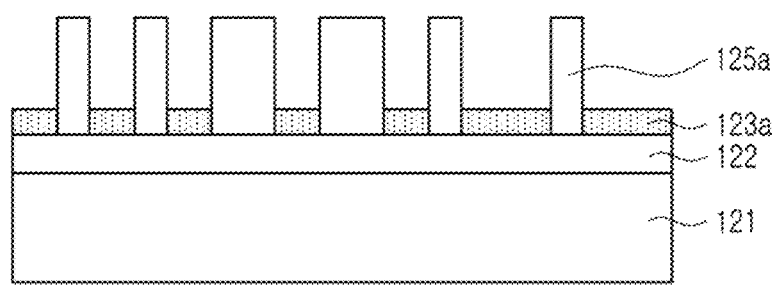

After the polarization process, the mask 125 may be partially removed using the etch stop layer to expose side surfaces of the planarized nanocores 125a as illustrated in FIG. 13C. That is, in a planarizing process according to an embodiment of the present inventive concept, only the second material layer 123b may be removed and the first material layer 123a may remain intact.

Figure 13D:
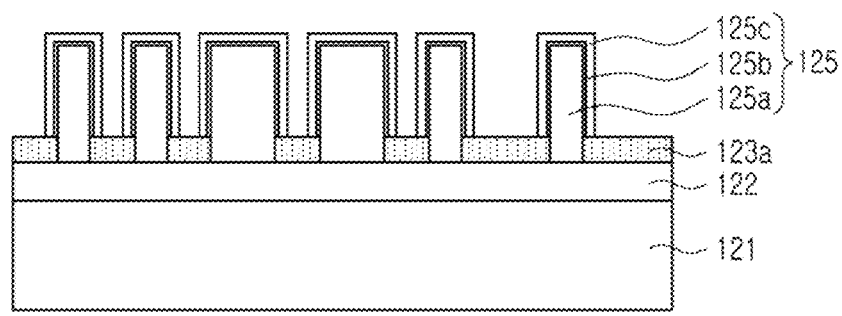

Subsequently, an active layer 125b and a second conductivity-type semiconductor layer 125c may be sequentially grown on the surfaces of the plurality of nanocores 125a as illustrated in FIG. 13D.

Through the above-mentioned process, a light emitting nanostructure 125 may have a core-shell structure in which the first conductivity-type semiconductor is provided as the nanocores 125a, and the active layer 125b and the second conductivity-type semiconductor layer 125c surrounding the nanocore 125a are provided as shell layers.

Specifically, although the active layer 125b is grown through the same process, a portion of the active layer grown on the top surface (e.g., c-plane) of the nanocore 125a may have a lower content of indium than a portion of the active layer 125b grown on the side surfaces (e.g., m-plane) of the nanocore 125a. As a result, the portion of the active layer 125b grown on the top surface (c-plane) of the nanocore 125a may emit light having a wavelength outside of an intended wavelength range. Thus, in an embodiment of the present inventive concept, a process of removing a portion of the active layer formed on a crystal plane of the nanocore, from which light having a wavelength beyond a desired wavelength range may be emitted, may be additionally performed as illustrated in FIGS. 13E and 13F.

Figure 13E:
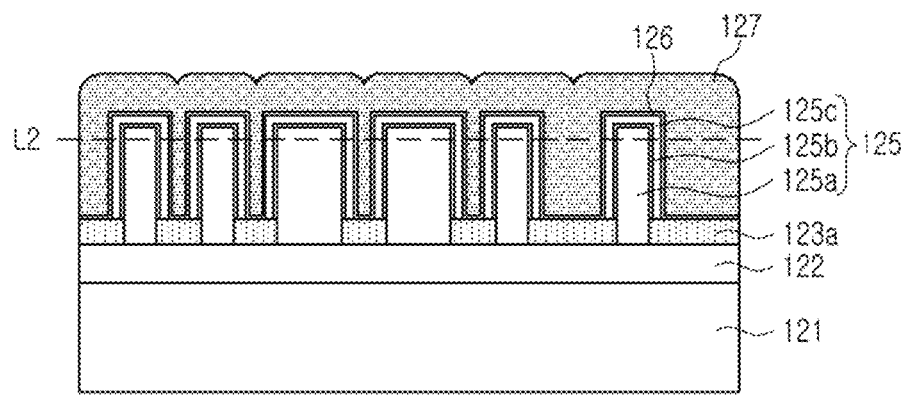
Figure 13F:
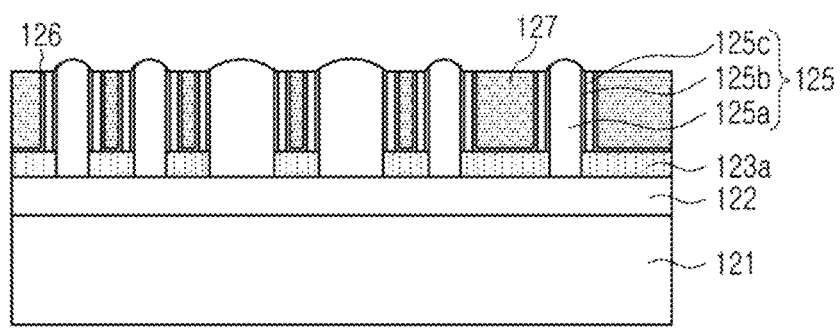

First, as illustrated in FIG. 13E, a contact electrode 126 may be formed on the light emitting nanostructures 125. In addition, an insulating protective layer 127 may be formed on the contact electrode 126. The insulating protective layers 127 may be formed to fill spaces between the light emitting nanostructures 125.

The contact electrode 126 may be formed of a material suitable for ohmic contact with the second conductivity-type semiconductor layer 125c. The contact electrode 126 may include a material such as Ag, Ni, Al, Rh, Pd, Ir, Ru, Mg, Zn, Pt, Au, or the like, and may have a structure of two or more layers, for example, a layer structure of Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. The contact electrode 126 may be formed by employing a transparent electrode material such as indium tin oxide (ITO), and griffin may be employed if necessary.

Electric insulating materials providing a passivation structure through semiconductor process may be used as the insulating protective layers 127. Materials such as $SiO_2$ or $SiN_x$ may be used as the insulating protective layers 127. Further, to easily fill the spaces between the light emitting nanostructures, materials such as Tetraethyl Ortho Silane (TEOS), Borophosphosilicate Glass (BPSG), CVD-$SiO_2$, Spin-on Glass (SOG), and Spin-on Dielectric (SOD) may be used as the insulating protective layers 127.

As illustrated in FIGS. 13E-13F, a first etching process of selectively removing an insulating protective layer 127 to expose the upper surface of the light emitting nanostructures 125 is applied, after which a second etching process of removing portions of the active layer disposed on the other plane (upper surface) of the nanocore 125a together with the contact electrode 126 may be performed.

In the first etching process, the insulating protective layer 127 is removed to a desired height (e.g., line L2 in FIG. 13E) by using dry etching or wet etching as the selective etching process to the insulating protective layer 127. For example, when the insulating protective layer 127 is an oxidation film or belongs to similar groups, plasma belonging to a CF group may be used for dry etching, and an etchant having HF such as BOE may be used for wet etching.

In the second etching process, the contact electrode 126, active layer 125b and a second conductivity-type semiconductor layer 125c may be removed from the exposed upper surface of the light emitting nanostructure 125. Thus, the remaining active layer 125b may be provided only in a side surface of the nanocore 125a. Since the side surface of the nanocore 125a has a specific crystal plane, the remaining active layer 125b may have the desired accurate wavelength characteristics. In the second etching process of selective etching process to the light emitting nanostructure 125 and the contact electrode 126, proper process conditions and etchants may be selected according to the material of the light emitting nanostructure 125 and the contact electrode 126. For example, when the contact electrode 126 is ITO, and the light emitting nanostructure 125 is a nitride single crystal, plasma etching process may be used, and $Cl_2$, $BCl_3$, Ar, or combinations thereof may be used as plasma gas.

As illustrated in FIG. 13F, the upper surface of the light emitting nanostructure 125 may have a non-planar surface. Though the upper surface of the light emitting nanostructure 125 may have various shapes according to conditions of the etching process and the etchant, it can be formed to have a nearly hemispherical shape structure. Since the upper surface of the light emitting nanostructure 125 obtained through the present embodiment of FIG. 13F, has a optical surface suitable for light extraction efficiency, the luminous efficiency may be improved.

Figure 14:
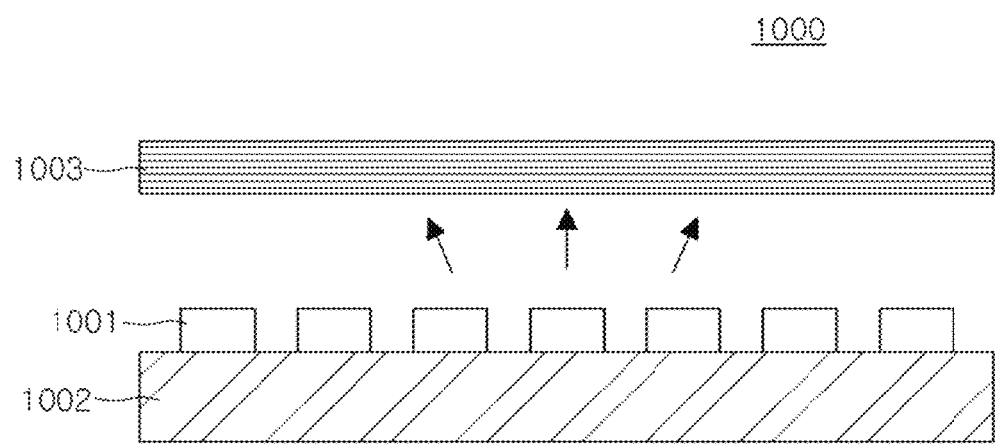
FIGS. 14 and 15 illustrate examples of a backlight unit to which a semiconductor light emitting device package according to an embodiment of the present inventive concept is applied.
Figure 15:
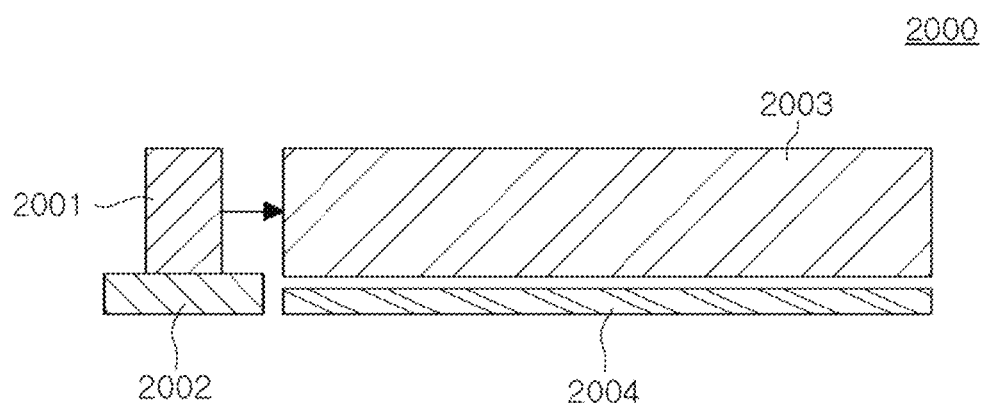

FIGS. 14 and 15 illustrate examples of a backlight unit to which a semiconductor light emitting device package according to an embodiment of the present inventive concept is applied.

With reference to FIG. 14, a backlight unit 1000 includes at least one light source 1001 mounted on a substrate 1002 and at least one optical sheet 1003 disposed thereabove. The light source 1001 may be a semiconductor light emitting device package having the above-described structure or a structure similar thereto.

The light source 1001 in the backlight unit 1000 of FIG. 14 emits light toward a liquid crystal display (LCD) device disposed thereabove, whereas a light source 2001 mounted on a substrate 2002 in a backlight unit 2000 of FIG. 15 emits light laterally and the light is incident to a light guide plate 2003 such that the backlight unit 2000 may serve as a surface light source. The light travelling to the light guide plate 2003 may be emitted upwardly and a reflective layer 2004 may be formed below a lower surface of the light guide plate 2003 in order to improve light extraction efficiency.

Figure 16:
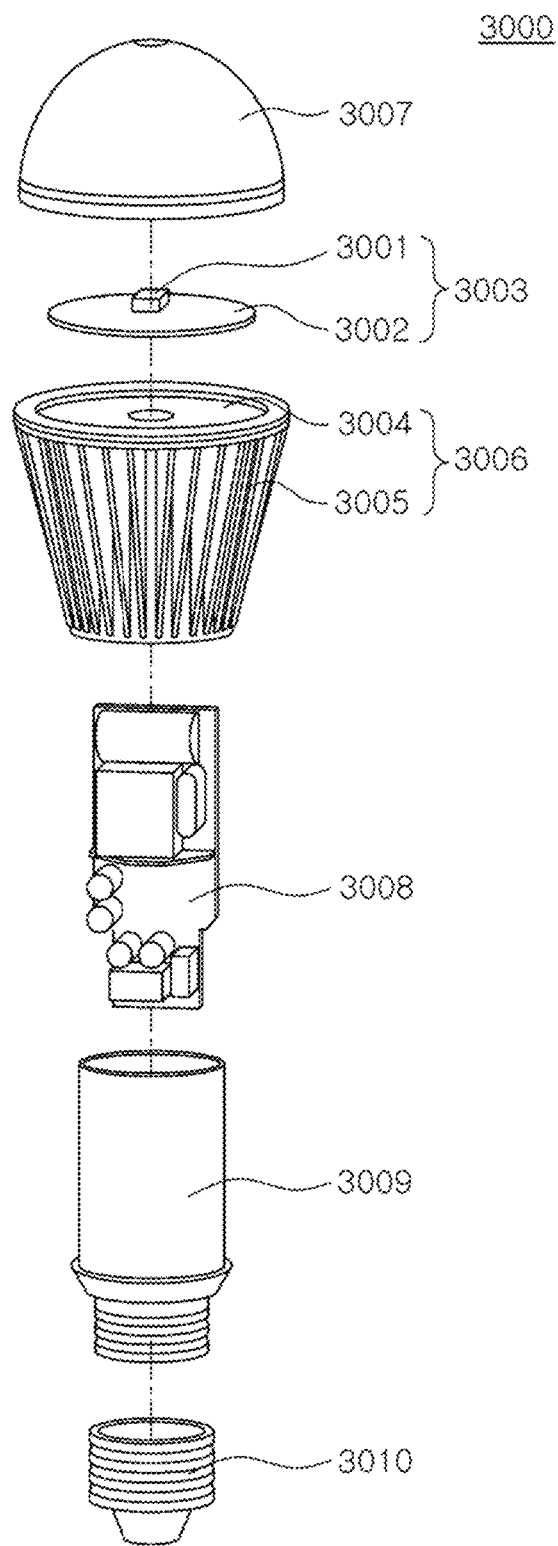
FIG. 16 illustrates an example of a lighting device to which a semiconductor light emitting device package according to an embodiment of the present inventive concept is applied.

FIG. 16 is an exploded perspective view illustrating an example of a lighting device to which a semiconductor light emitting device package according to an embodiment of the present inventive concept is applied.

A lighting device 3000 of FIG. 16 is exemplified as a bulb-type lamp, and includes a light emitting module 3003, a driving unit 3008 and an external connector unit 3010.

In addition, exterior structures, such as external and internal housings 3006 and 3009, a cover unit 3007, and the like, may be additionally included. The light emitting module 3003 may include a light source 3001 having the above-described semiconductor light emitting device package structure or a structure similar thereto and a circuit board 3002 having the light source 3001 mounted thereon. For example, the first and second connection electrodes of the semiconductor light emitting device may be connected to an electrode pattern of the circuit board 3002. In the present embodiment, a single light source 3001 is mounted on the circuit board 3002; however a plurality of light sources may be mounted thereon as necessary.

The external housing 3006 may serve as a heat radiating unit, and may include a heat sink plate 3004 in direct contact with the light emitting module 3003 to thereby improve heat dissipation, and a heat radiating fin 3005 surrounding a lateral surface of the lighting device 3000. In addition, the cover unit 3007 may be disposed above the light emitting module 3003 and have a convex lens shape. The driving unit 3008 may be disposed inside the internal housing 3009 and connected to the external connector unit 3010 such as a socket structure to receive power from an external power source. In addition, the driving unit 3008 may convert the received power into power appropriate for driving the semiconductor light emitting device 3001 of the light emitting module 3003 and supply the converted power thereto. For example, the driving unit 3008 may be provided as an AC-DC converter, a rectifying circuit part, or the like.

Figure 17:
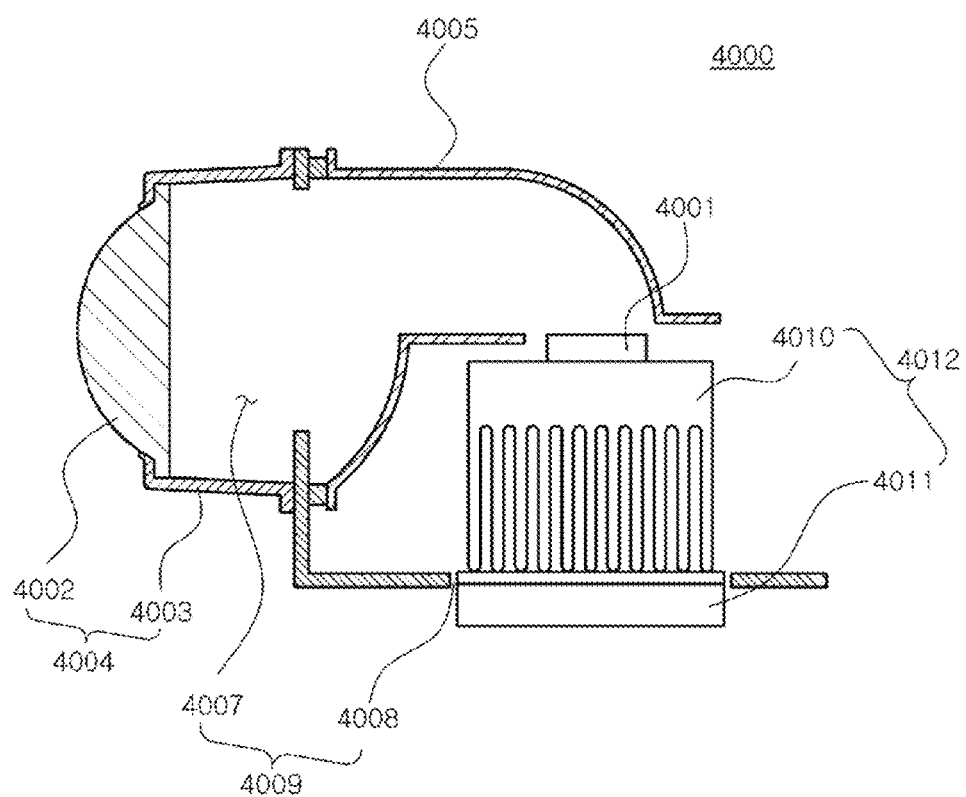
FIG. 17 illustrates an example of a headlamp to which a semiconductor light emitting device package according to an embodiment of the present inventive concept is applied.

FIG. 17 illustrates an example of a headlamp to which a semiconductor light emitting device package according to an embodiment of the present inventive concept is applied.

With reference to FIG. 17, a headlamp 4000 used in a vehicle or the like may include a light source 4001, a reflective unit 4005 and a lens cover unit 4004, the lens cover unit 4004 including a hollow guide part 4003 and a lens 4002. The light source 4001 may include at least one semiconductor light emitting device package having the above-described structure or a structure similar thereto.

The headlamp 4000 may further include a heat radiating unit 4012 outwardly dissipating heat generated in the light source 4001. The heat radiating unit 4012 may include a heat sink 4010 and a cooling fan 4011 in order to effectively dissipate heat. In addition, the headlamp 4000 may further include a housing 4009, allowing the heat radiating unit 4012 and the reflective unit 4005 to be fixed thereto and supporting them. One surface of the housing 4009 may be provided with a central hole 4008 into which the heat radiating unit 4012 is inserted to be coupled thereto.

The other surface of the housing 4009 bent in a direction perpendicular to one surface of the housing 4009 may be provided with a forwardly open hole 4007 such that light generated in the light source 4001 may be reflected by the reflective unit 4005 disposed above the light source 4001, pass through the forwardly open hole 4007, and be emitted outwardly.

As set forth above, according to exemplary embodiments of the present inventive concept, constant optical properties may be provided on entire areas of active layers, since active layers may be grown on a specific crystal plane even in a case in which a nanostructure semiconductor light emitting device is employed, and luminous extraction efficiency may be greatly enhanced by forming upper surfaces of a light emitting nanostructures to have non-planar shapes. Additionally, a leakage current generated on active layers to be disposed on an upper surface of nanostructure semiconductor light emitting device may also be prevented.

While exemplary embodiments have been shown and described above, it will be apparent to those skilled in the art that modifications and variations could be made without departing from the spirit and scope of the present disclosure as defined by the appended claims.

What is claimed is:

1. A nanostructure semiconductor light emitting device, comprising:
    a base layer formed of a first conductivity-type semiconductor;
    an insulating layer disposed on the base layer and having a plurality of openings through which regions of the base layer are exposed; and
    a plurality of light emitting nanostructures, each being disposed on the exposed regions of the base layer and including a nanocore formed of a first conductivity-type semiconductor, and an active layer and a second conductivity-type semiconductor layer which are sequentially disposed on side surfaces of the nanocore,
    wherein upper surfaces of the light emitting nanostructures are non-planar and contain portions free of the active layer and the second conductivity-type semiconductor layer in order to prevent light emissions during device driving.

2. The nanostructure semiconductor light emitting device of claim 1, wherein the nanocore is exposed through the portions of the upper surfaces of the light emitting nanostructures that are free of the second conductivity-type semiconductor layer and the active layer.

3. The nanostructure semiconductor light emitting device of claim 1, wherein the side surfaces of the nanocore have a crystal plane and the active layer is disposed on the side surfaces of the nanocores.

4. The nanostructure semiconductor light emitting device of claim 1, wherein the side surfaces of the nanocore have a crystal plane that is perpendicular to an upper surface of the base layer.

5. The nanostructure semiconductor light emitting device of claim 1, wherein the light emitting nanostructure and the base layer are formed of nitride single crystals.

6. The nanostructure semiconductor light emitting device of claim 5, wherein the side surfaces of the nanocore have non-polar plane.

7. The nanostructure semiconductor light emitting device of claim 1, wherein the non-planar upper surfaces of the light emitting nanostructure have a convex or concave shape.

8. The nanostructure semiconductor light emitting device of claim 1, wherein the non-planar upper surfaces of the light emitting nanostructures are uneven surfaces.

9. The nanostructure semiconductor light emitting device of claim 1, further comprising:
a contact electrode disposed on surfaces of the second conductivity-type semiconductor layers,
wherein the non-planar upper surfaces of the light emitting nanostructures are free of the contact electrode thereon.

10. The nanostructure semiconductor light emitting device of claim 1, wherein a group of nanocores among the plurality of nanocores have cross-sectional areas different from cross-sectional areas of a remaining group of nanocores among the plurality of nanocores.

11. The nanostructure semiconductor light emitting device of claim 1, wherein a group of nanocores among the plurality of nanocores have an interval therebetween different from an interval between a remaining group of nanocores among the plurality of nanocores.

12. A nanostructure semiconductor light emitting device, comprising: a base layer formed of a first conductivity-type semiconductor;
an insulating layer disposed on the base layer and having a plurality of openings through which regions of the base layer are exposed;
a plurality of nanocores, each being disposed on the exposed regions of the base layer and being formed of a first conductivity-type semiconductor; and
active layers and second conductivity-type semiconductor layers, sequentially disposed on side surfaces of the nanocores; and
a contact electrode disposed on surfaces of the second conductivity-type semiconductor wherein the side surfaces of the nanocores have a crystal plane, and the upper surfaces of the nanocores are non-planar, and
wherein the non-planar upper surfaces of the nanocores are free of the contact electrode thereon.

13. The nanostructure semiconductor light emitting device of claim 12, wherein the active layers are disposed only on the side surfaces of the nanocores.

14. The nanostructure semiconductor light emitting device of claim 13, wherein the side surfaces of the nanocores have a crystal plane that is perpendicular to an upper surface of the base layer.

15. The nanostructure semiconductor light emitting device of claim 14, wherein:
the light emitting nanostructures and the base layers are nitride single crystals, and
the side surfaces of the nanocores have a non-polar plane.

16. A nanostructure semiconductor light emitting device, comprising:
a base layer formed of a first conductivity-type semiconductor;
an insulating layer disposed on the base layer and having a plurality of openings through which regions of the base layer are exposed; and
a plurality of light emitting nanostructures, each being disposed on the exposed regions of the base layer and including a nanocore formed of a first conductivity-type semiconductor, and an active layer and a second conductivity-type semiconductor layer which are sequentially disposed on side surfaces of the nanocore,
wherein upper surfaces of the light emitting nanostructures are non-planar and contain portions free of the active layer.

17. The nanostructure semiconductor light emitting device of claim 16, wherein the upper surfaces of the light emitting nanostructures contain portions free of the second conductivity-type semiconductor layer and the active layer, whereby the nanocore is exposed.

18. The nanostructure semiconductor light emitting device of claim 16, wherein the side surfaces of the nanocore have a crystal plane and the active layer is disposed on the side surfaces of the nanocores.

19. The nanostructure semiconductor light emitting device of claim 16, wherein the side surfaces of the nanocore have a crystal plane that is perpendicular to an upper surface of the base layer.

20. The nanostructure semiconductor light emitting device of claim 16, wherein the light emitting nanostructure and the base layer are formed of nitride single crystals.

* * * * *